(12) United States Patent
Nozu et al.

(10) Patent No.: US 10,958,860 B2
(45) Date of Patent: Mar. 23, 2021

(54) MODULE AND METHOD OF MANUFACTURING MODULE

(71) Applicant: CANON KABUSHIKI KAISHA, Tokyo (JP)

(72) Inventors: Satoshi Nozu, Ebina (JP); Yu Aoki, Ayase (JP); Koji Tsuduki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/511,405

(22) Filed: Jul. 15, 2019

(65) Prior Publication Data

US 2020/0029039 A1 Jan. 23, 2020

(30) Foreign Application Priority Data

Jul. 23, 2018 (JP) .............................. JP2018-137580

(51) Int. Cl.
  *H01L 27/00* (2006.01)
  *H04N 5/374* (2011.01)
  (Continued)

(52) U.S. Cl.
  CPC ............ *H04N 5/374* (2013.01); *H01L 27/01* (2013.01); *H01L 27/146* (2013.01);
  (Continued)

(58) Field of Classification Search
  CPC . H01L 27/01; H01L 27/146; H01L 27/14643; H01L 27/1469; H04N 5/374; H04N 5/2253; H04N 5/2257; H04N 5/2254; H04N 5/2252; H05K 1/0298; H05K 1/0289; H05K 1/115; H05K 1/0209;
  (Continued)

(56) References Cited

U.S. PATENT DOCUMENTS 8,680,669 B2 * 3/2014 Kurihara .............. B23K 1/0016
  257/704
9,774,769 B2 9/2017 Suzuki
(Continued)

FOREIGN PATENT DOCUMENTS

| JP | 2006-303096 | 11/2006 |
| JP | 2015-12211 | 1/2015 |
| JP | 2017-120848 | 7/2017 |

*Primary Examiner* — Nikolay K Yushin
(74) *Attorney, Agent, or Firm* — Venable LLP

(57) ABSTRACT

A method includes preparing a circuit board that includes a first metal pattern over a first face side of the substrate, a first electrode in a periphery of the first metal pattern, a second electrode over a second face side of the substrate, and a second metal pattern thermally connected to the first metal pattern and in which an electronic device is fixed on the first metal pattern and an electronic component is electrically connected to the second electrode, and connecting the first electrode and a third electrode of the electronic device by a bonding wire with the electronic device being heated. By a board support stage, the electronic device is heated by transferring heat to the electronic device via the second and then first metal pattern with the circuit board being supported to form a space including the electronic component between the second face and the board support stage.

20 Claims, 18 Drawing Sheets

(51) Int. Cl.
*H01L 27/01* (2006.01)
*H05K 1/02* (2006.01)
*H01L 27/146* (2006.01)

(52) U.S. Cl.
CPC ... *H05K 1/0298* (2013.01); *H05K 2201/0361* (2013.01); *H05K 2201/2018* (2013.01)

(58) Field of Classification Search
CPC ............ H05K 1/14; H05K 2201/2018; H05K 2201/0361; H05K 2201/09472
See application file for complete search history.

(56) References Cited

U.S. PATENT DOCUMENTS

| | | | |
|---|---|---|---|
| 9,978,675 B2 | 5/2018 | Suzuki | |
| 9,991,304 B2 * | 6/2018 | Kimura | H01L 27/1462 |
| 10,304,752 B2 * | 5/2019 | Arima | H04N 5/2253 |
| 2013/0083493 A1 * | 4/2013 | Kurihara | B23K 1/008 |
| | | | 361/728 |
| 2013/0286565 A1 | 10/2013 | Tsuduki | |
| 2013/0286566 A1 | 10/2013 | Tsuduki | |
| 2013/0286592 A1 | 10/2013 | Tsuduki | |
| 2014/0339668 A1 | 11/2014 | Arima | |
| 2016/0293650 A1 * | 10/2016 | Kimura | H01L 27/14627 |
| 2016/0307954 A1 | 10/2016 | Arima | |

\* cited by examiner

MODULE AND METHOD OF MANUFACTURING MODULE

BACKGROUND OF THE INVENTION

Field of the Invention

The present invention relates to a module and a method of manufacturing the module.

Description of the Related Art

An imaging unit in which a solid-state imaging device is mounted on one face of a mount board and electronic components are mounted on the other face has been proposed. Japanese Patent Application Laid-Open No. 2017-120848 discloses an imaging unit in which a mount board and a solid-state imaging device mounted thereon are electrically connected by using bonding wires.

Wire connection using a wire bonding method is performed with the temperature increased above around 150 degrees Celsius in order to form a high quality alloy state at a connection portion of the wire. When wire bonding connection is performed with an electronic device being mounted on a mount board on which electronic components are mounted, however, the electronic components will also be heated at the same time when the mount board and the electronic device are heated. The electronic components mounted on the mount board are active components such as a capacitor, a transistor, a connector for flexible substrate, or the like which do not necessarily have heat resistance around 150 degrees Celsius and thus may be damaged due to heat when heated.

SUMMARY OF THE INVENTION

The present invention intends to provide a module and a method of manufacturing the same that may realize wire connection between a mount board and an electronic device while preventing damage of electronic components mounted on the mount board.

According to one aspect of the present invention, provided is a method of manufacturing a module including preparing a circuit board that includes a substrate having a first face and a second face, a first metal pattern provided over the first face side, a first electrode provided in a periphery of the first metal pattern over the first face side, a second electrode provided over the second face side, and a second metal pattern thermally connected to the first metal pattern and in which an electronic device is fixed on the first metal pattern and an electronic component is electrically connected to the second electrode, and connecting the first electrode and a third electrode of the electronic device to each other by a bonding wire with the electronic device being heated, wherein in the connecting, by using a board support stage, the electronic device is heated by transferring heat supplied to the second metal pattern to the electronic device via the first metal pattern with the circuit board being supported so as to form a space including the electronic component between the second face and the board support stage.

Further, according to another aspect of the present invention, provided is a module including a circuit board that includes a substrate having a first face and a second face, a first metal pattern provided over the first face side, a first electrode provided in a periphery of the first metal pattern over the first face side, a second metal pattern, and a second electrode provided over the second face side, an electronic component provided over the second face side and electrically connected to the second electrode, an electronic device provided over the first face side and joined to the first metal pattern, and a bonding wire that electrically connects the first electrode and a third electrode of the electronic device to each other, wherein a thermal resistance value between the first metal pattern and the second metal pattern is smaller than a thermal resistance value between the second metal pattern and the second electrode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
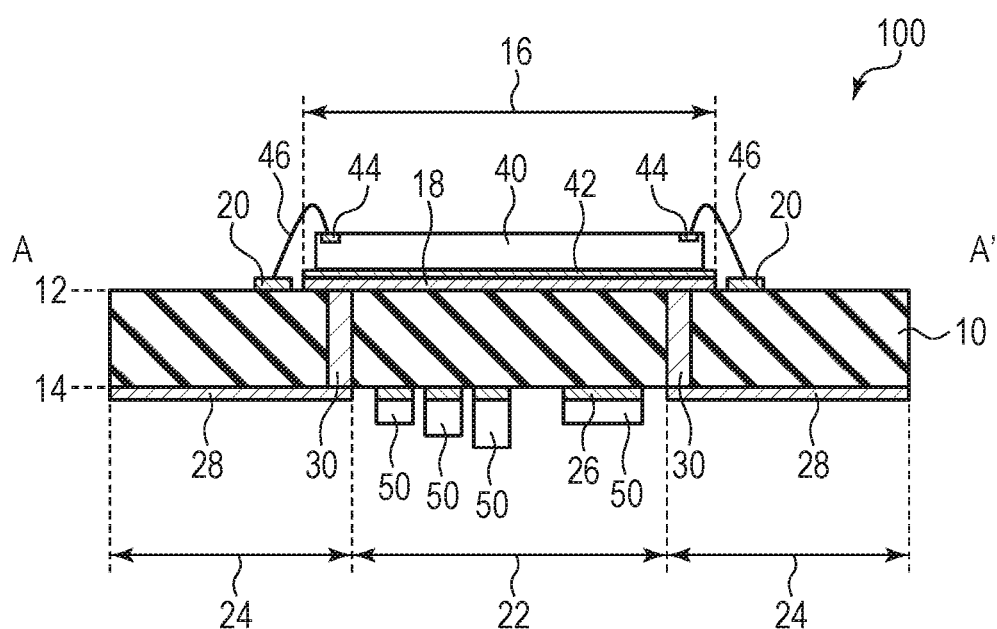
FIG. 1 is a schematic cross-sectional view illustrating the structure of a module according to a first embodiment of the present invention.
Figure 2:
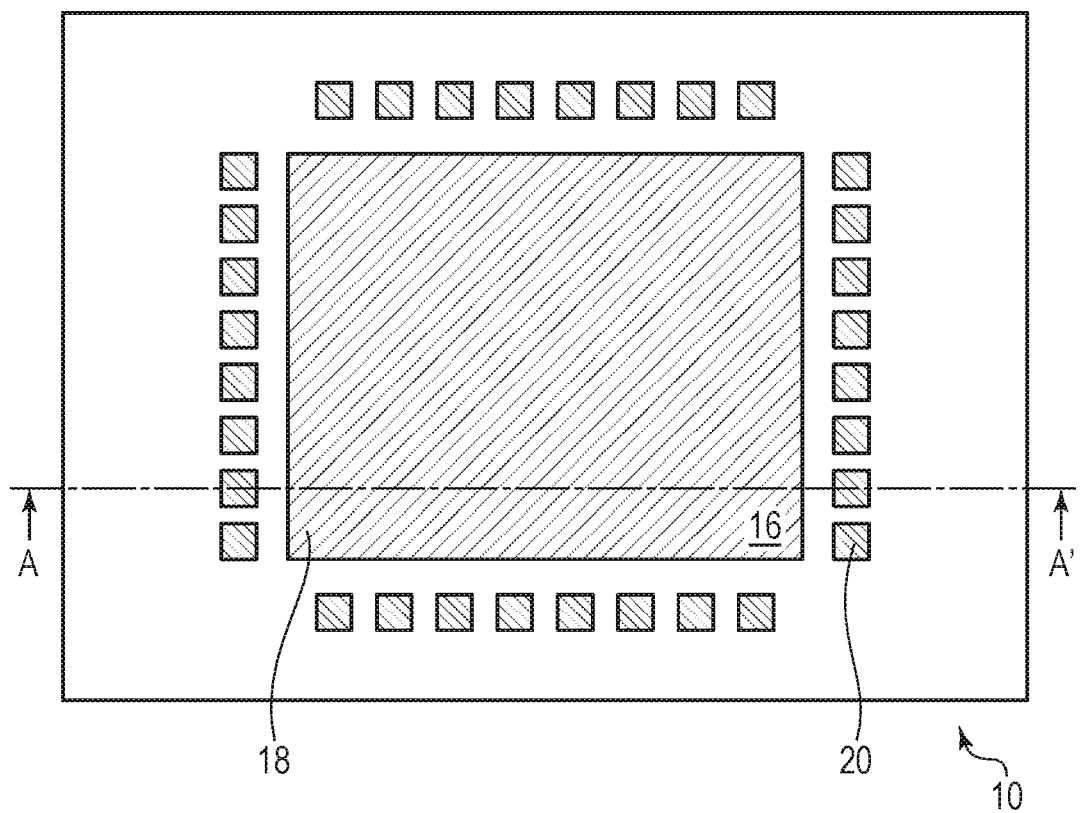
FIG. 2 and FIG. 3 are plan views illustrating the structure of a circuit board of the module according to the first embodiment of the present invention.
Figure 3:
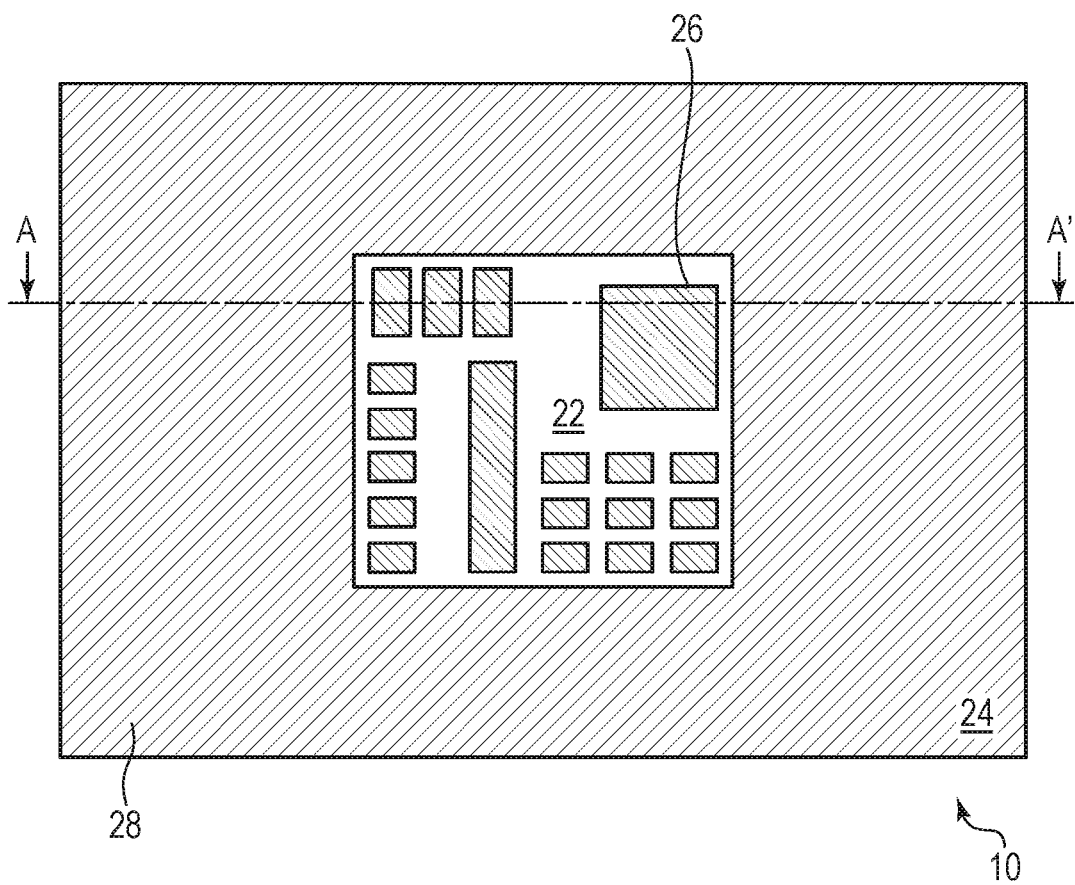
Figure 4A:
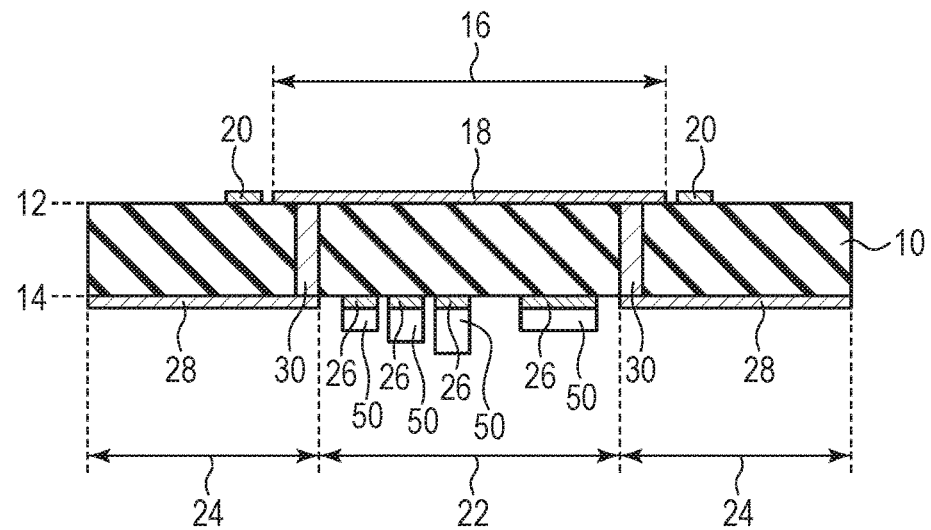
FIG. 4A, FIG. 4B and FIG. 4C are cross-sectional views illustrating a method of manufacturing the module according to the first embodiment of the present invention.
Figure 4B:
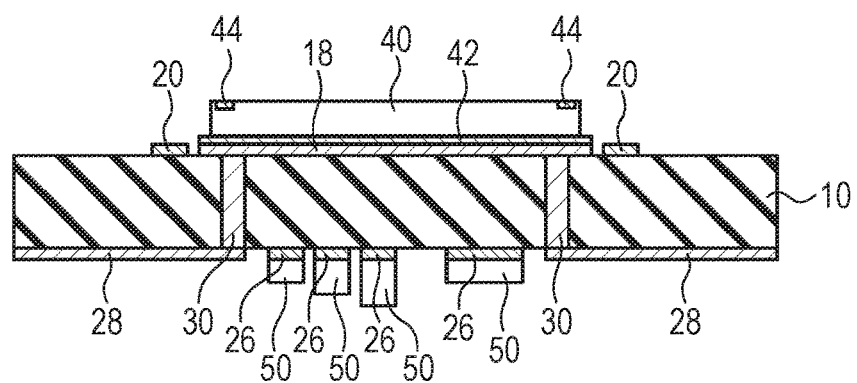
Figure 4C:
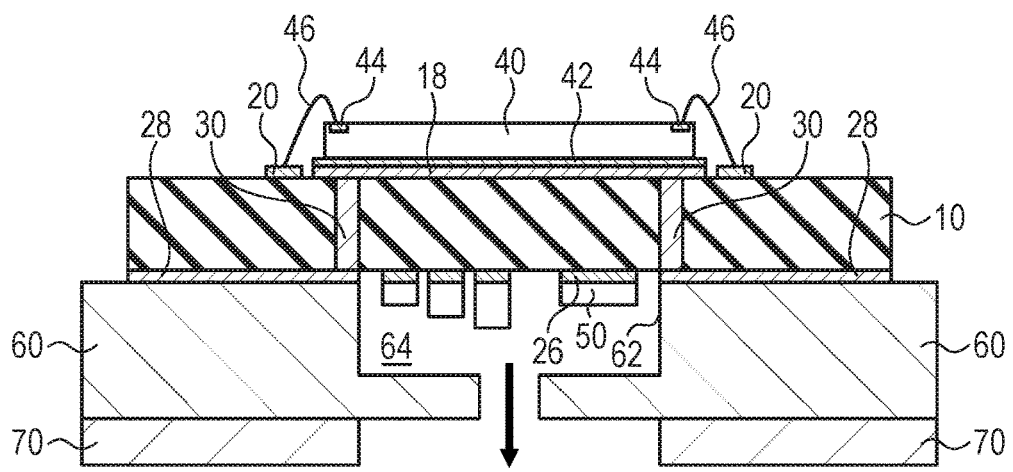

A module and a method of manufacturing the same according to a first embodiment of the present invention will be described with reference to FIG. 1 to FIG. 4C. FIG. 1 is a schematic cross-sectional view illustrating the structure of a module according to the present embodiment. FIG. 2 and FIG. 3 are plan views illustrating the structure of the module according to the present embodiment. FIG. 4A to FIG. 4C are cross-sectional views illustrating a method of manufacturing the module according to the present embodiment.

As illustrated in FIG. 1, a module 100 according to the present embodiment includes a circuit board 10, and an electronic device 40 and electronic components 50 mounted on the circuit board 10. The electronic device 40 of this example is an imaging device such as a CMOS image sensor, and the module 100 may be referred to as an imaging module. The electronic device 40 may be a semiconductor device other than the imaging device and may be a display device such as an organic EL display.

The circuit board 10 is a printed board made of a plate-like base material such as a glass epoxy substrate, a ceramic substrate, a paper phenol substrate, or the like, for example. The circuit board 10 is a multilayer circuit board having at least two interconnection layers and may be formed of a double-sided substrate, a multilayer substrate, a buildup substrate, or the like, for example. FIG. 1 illustrates only a portion related to a primary feature of the present invention out of members provided to the circuit board 10 (interconnections, electrodes, vias, and the like). The circuit board 10 is a substrate having a first face 12 and a second face 14 that are a pair of faces opposed to each other. The thickness of the circuit board 10 is around 0.1 mm to 2.0 mm, for example.

FIG. 2 is a plan view of the circuit board 10 when viewed from the first face 12 side. The circuit board 10 has, on the first face 12 side, an imaging-device mount region 16 in which the electronic device 40 is mounted. The imaging-device mount region 16 is located around the center of the first face 12. A metal pattern 18 is provided in the imaging-device mount region 16 of the circuit board 10. A plurality of electrodes 20 are provided around the imaging-device mount region 16 of the circuit board 10. The metal pattern 18 and the electrodes 20 may be formed of the same metal layer. The same metal layer as used herein means that the metal pattern 18 and the electrodes 20 have substantially the same distance from the substrate. Having substantially the same distance from the substrate means that the distance difference of both is less than the thickness of the metal pattern 18. A metal material forming a metal layer may be a single-material metal, an alloy, or a compound including gold, silver, copper, aluminum, nickel, chrome, zinc, or tin. Not only a single-material metal but also an alloy or a compound can be regarded as a metal material.

FIG. 1 illustrates an example in which the metal pattern 18 is formed by using an interconnection layer located in the outermost layer on the first face 12 side. When the circuit board 10 is a multilayer substrate, a buildup substrate, or the like, the metal pattern 18 may be formed by using an interconnection layer located inside the circuit board 10. In such a case, it is preferable that the metal pattern 18 be located on the first face 12 side of a position which divides the thickness of the circuit board 10 into two equal parts.

FIG. 3 is a plan view of the circuit board 10 when viewed from the second face 14 side. The circuit board 10 has, on the second face 14 side, a component mount region 22 in which the electronic components 50 are mounted and a non-component mount region 24 in which the electronic components 50 are not mounted. It is preferable that the component mount region 22 be located in a region including the center part of the circuit board 10 in terms of easier arrangement of a board support stage or a heater apparatus in a wire bonding step described later. In such a case, the periphery of the component mount region 22 is the non-component mount region 24. Electrodes 26 used for connecting the electronic components 50 are provided in the component mount region 22. A metal pattern 28 is provided in the non-component mount region 24. The metal pattern 28 and the electrodes 26 may be formed of the same metal layer. The same metal layer as used herein means that the metal pattern 28 and the electrodes 26 have substantially the same distance from the substrate. Having substantially the same distance from the substrate means that the distance difference of both is less than the thickness of the metal pattern 28. A material forming a metal layer may be a single-material metal, an alloy, or a compound including gold, silver, copper, aluminum, nickel, chrome, zinc, or tin. Not only a single-material metal but also an alloy or a compound can be considered to be a metal material.

FIG. 1 illustrates an example in which the metal pattern 28 is formed by using an interconnection layer located in the outermost layer on the second face 14 side. When the circuit board 10 is a multilayer substrate, a buildup substrate, or the like, the metal pattern 28 may be formed by using an interconnection layer located inside the circuit board 10. In such a case, it is preferable that the metal pattern 28 be located on the second face 14 side of a position which divides the thickness of the circuit board 10 into two equal parts.

The metal pattern 18 and the metal pattern 28 are interconnected by using a conductive member (members 30) such as a through via or an interconnection layer arranged so as to electrically connect the first face 12 side and the second face 14 side of the circuit board 10 to each other. In general, a conductive member represented by a metal material has a higher thermal conductivity than an insulating member such as a resin material. Therefore, connecting the metal pattern 18 and the metal pattern 28 to each other via a conductive member is the same as forming a thermal conductive path between the metal pattern 18 and the metal pattern 28. That is, each member 30 serves as a thermal conductive member and thermally connects the metal pattern 18 and the metal pattern 28 to each other. Note that the member 30 is primarily intended to thermally connect the metal pattern 18 and the metal pattern 28 and may not necessarily be required to have conductivity.

It is preferable that the metal pattern 28 and the electrodes 26 be formed of separate conductive patterns that are not electrically connected. Thereby, when the electronic device 40 is heated via the metal pattern 28, heat is mostly transferred from the metal pattern 28 to the metal pattern 18, and the metal pattern 18 can be efficiently heated. Further, it is possible to suppress the electronic components 50 from being heated by heat transfer from the metal pattern 28 to the electrodes 26. Such a wiring form is more effective when the circuit board 10 is formed of a material having a small thermal conductivity, for example, when the circuit board 10 is a glass epoxy substrate.

Note that, while the metal pattern 28 and the electrodes 26 being not conducted is one preferable form, it is possible to form the metal pattern 28 and the electrodes 26 to be conducted. In such a case, a wiring connected between the metal pattern 28 and the electrodes 26 is made suitable such that the thermal resistance value between the metal pattern 18 and the metal pattern 28 is lower than the thermal resistance value between the metal pattern 28 and the electrodes 26. For example, the thermal resistance value between the metal pattern 28 and the electrodes 26 can be increased by increasing the wiring length or reducing the wiring width between the metal pattern 28 and the electrodes 26. It is desirable that the thermal resistance value between the metal pattern 18 and the metal pattern 28 be less than or equal to one-tenth of the thermal resistance value between the metal pattern 28 and the electrodes 26.

The electronic device 40 is not particularly limited but typically may be an imaging device such as a CCD image sensor or a CMOS image sensor. The electronic device 40 includes a plurality of electrodes 44 as external connection terminals. The electronic device 40 is jointed to a portion of the metal pattern 18 of the imaging-device mount region 16 of the circuit board 10 by using a die bonding paste 42, for example. The electrodes 20 of the circuit board 10 and the electrodes 44 of the electronic device 40 are electrically connected via bonding wires 46.

Each of the electronic components 50 is not particularly limited but may be, for example, a resistor, a ceramic capacitor, an organic polymer capacitor, a connector of a flexible cable, a ROM, or the like. At least some of the plurality of electronic components 50 may be a passive component. The electronic components 50 are joined to the electrodes 26 of the circuit board 10 by soldering or the like. The present invention is particularly effective for a case where a component whose heat resistant temperature is lower than or equal to around 150 degrees Celsius is included in the electronic components 50.

Next, a method of manufacturing the module according to the present embodiment will be described by using FIG. 4A to FIG. 4C. First, the circuit board 10 is prepared. The circuit board 10 in the present embodiment includes the metal pattern 18 and the electrodes 20 provided on the first face 12 side and the electrodes 26 and the metal pattern 28 provided on the second face 14 side as described previously. In addition, the circuit board 10 further includes the members 30 that electrically and thermally connect the metal pattern 18 and the metal pattern 28 to each other.

Next, the electronic components 50 are joined on the electrodes 26 provided in the component mount region 22 of the second face 14 of the circuit board 10 by soldering or the like (FIG. 4A). Thereby, the circuit board 10 on which the electronic components 50 are electrically connected to the electrodes 26 is prepared.

Next, the electronic device 40 is fixed on the metal pattern 18 provided in the imaging-device mount region 16 of the first face 12 of the circuit board 10 (FIG. 4B). The electronic device 40 is joined to the metal pattern 18 at a face opposite to a face on which the electrodes 44 are provided by using the die bonding paste 42 or the like. The die bonding paste 42 is a carbon paste, a silver paste, or the like and the thickness thereof is around 1 μm to 50 μm. Note that it is desirable that the die bonding paste 42 be a conductive material in terms of a high heat conductivity being obtained in addition to electrical connection.

Next, the electrodes 44 of the electronic device 40 and the electrodes 20 of the circuit board 10 are connected to each other by the bonding wires 46 each made of a gold wire or the like by using a known wire bonding method (FIG. 4C).

First, the circuit board 10 on which the electronic device 40 and the electronic components 50 are mounted is placed on the board support stage 60 of a wire bonding apparatus. The circuit board 10 is placed on the board support stage 60 such that the second face 14 side faces the board support stage 60. Thereby, the metal pattern 28 of the circuit board 10 and the board support stage 60 are contacted with each other. On the other hand, a concave part 62 is provided in a portion corresponding to the component mount region 22 of the board support stage 60, and thereby neither the electronic components 50 nor the electrodes 26 contacts with the board support stage 60 when the circuit board 10 is placed on the board support stage 60. The board support stage 60 forms a space 64 including the electronic components 50 between the second face 14 and the board support stage 60 with the circuit board 10 being supported.

An exhausting apparatus (not illustrated) is connected to the space 64 defined by the circuit board 10 and the concave part 62 of the board support stage 60. Thereby, the space 64 can be vacuumed as schematically illustrated by an arrow in FIG. 4C. Thereby, the circuit board 10 is fixed to the board support stage 60, and the metal pattern 28 of the circuit board 10 is stuck to the board support stage 60.

Next, the electronic device 40 of the circuit board 10 placed on the board support stage 60 is heated. The wire bonding apparatus includes a heater apparatus 70 such as a heater below the board support stage 60. By increasing the temperature of the heater apparatus 70, it is possible to supply heat to and heat the metal pattern 28 of the circuit board 10 via the board support stage 60. Further, since the metal pattern 28 is thermally connected to the metal pattern 18 via the members 30, which are thermal conductive members, when the metal pattern 28 is heated, the metal pattern 18 can be heated, and thus the electronic device 40 can be heated. With the board support stage 60, the metal pattern 28, the members 30, and the metal pattern 18 being formed of a material having a high thermal conductivity, for example, copper, the electronic device 40 can be effectively heated.

At this time, the electronic components 50 are not in direct contact with the board support stage 60 and are arranged inside the space 64 in which the pressure is reduced and no air exists, and therefore are less likely to be affected by heat emitted from the heater apparatus 70. Further, since a part between the electronic components 50 and the metal pattern 28 is electrically disconnected or has a larger thermal resistance than the path between the metal pattern 28 and the metal pattern 18, the heat from the metal pattern 28 is less likely to transfer to the electronic components 50. It is therefore possible to suppress a rise in temperature of the electronic components 50 due to heating of the heater apparatus 70.

The metal pattern 28 of the circuit board 10 is preferably arranged annularly along the outer circumference of the second face 14 as illustrated in FIG. 3, for example. Such arrangement of the metal pattern 28 enables the electronic device 40 to be heated from outer circumference directions of the four sides. Thereby, the electronic device 40 and the electrodes 44 thereof can be effectively heated.

Further, it is preferable that the area of the metal pattern 28 in a planar view be larger than the area of the electronic device 40 or the metal pattern 18 in the planar view. When the metal pattern 28 has a larger area than the electronic device 40, a contact area between the board support stage 60 and the metal pattern 28 can be larger, and thus the board support stage 60 can be larger than the electronic device 40. That is, the heater apparatus 70 in contact with the board support stage 60 can be larger, and the electronic device 40 can be effectively heated. Note that, in the present specification, the planar view refers to a two-dimensional plan view obtained by projecting each component onto a face parallel to the surface (the first face 12 and the second face 14) of the circuit board 10.

In such a way, with the electronic device 40 being heated at a predetermined temperature, it is possible to cause the electrodes 44 of the electronic device 40 and the electrodes 20 to be connected by the bonding wires 46 by a known wire bonding method. At this time, according to the configuration of the present embodiment, since a rise in temperature of the electronic components 50 can be suppressed, a component whose heat resistant temperature is less than or equal to around 150 degrees Celsius can also be used as the electronic components 50.

Note that it is preferable that the non-component mount region 24 include an orthographic projection region of the electrodes 44 of the electronic device 40 onto the second face 14. In other words, it is desirable that the non-component mount region 24 and the electrodes 44 of the electronic device 40 be overlapped in a direction perpendicular to the first face 12. With such a configuration, the board support stage 60 can support the circuit board 10 at a region including an orthographic projection region of the electrodes 44 of the electronic device 40. That is, this results in a state where the board support stage 60 is located right under the electrodes 44 of the electronic device 40. Thereby, when the bonding wire 46 is connected to the electrodes 44 of the electronic device 40, the pressure occurring when metal balls or metal wires are pressed against the electrodes 44 can be directly received by the board support stage 60, which can increase stability.

Further, it is more desirable that the region in which the metal pattern 28 is provided include the orthographic projection region of the electrodes 44 of the electronic device 40 onto the second face 14. In other words, it is desirable that the metal pattern 28 and the electrodes 44 of the electronic device 40 be overlapped in a direction perpendicular to the first face 12. With such a configuration, the distance between the metal pattern 28 and the electrodes 44 of the electronic device 40 can be shorter. In such a case, as illustrated in FIG. 4C, for example, the metal pattern 28 and the metal pattern 18 can be connected by the members 30 each extending straight along a direction perpendicular to the surface of the circuit board 10, and thus heat can be effectively transferred from the metal pattern 28 to the electrodes 44.

Similarly, it is desirable that the region in which the metal pattern 18 is provided include the orthographic projection region of the electrodes 44 of the electronic device 40 onto the first face 12. In other words, it is desirable that the metal pattern 18 and the electrodes 44 of the electronic device 40 be overlapped in a direction perpendicular to the first face 12. Moreover, it is desirable that the region in which the metal pattern 18 is provided include the entire orthographic projection region of the electronic device 40 onto the first face 12. In other words, it is desirable that the metal pattern 18 and the entire electronic device 40 be overlapped in a direction perpendicular to the first face 12. With such a configuration, the entire electronic device 40 can be heated via the metal pattern 18, and the electronic device 40 can be heated up to a predetermined temperature more quickly and effectively. This can suppress a rise in temperature of the electronic components 50.

As described so far, one of the objects of the present embodiment is to heat the electrodes 44 up to a predetermined temperature while suppressing a rise in temperature of the electronic components 50. That is, a larger thermal resistance between the metal pattern 28 and the electrodes 26 will more contribute to that object. In this sense, a resin material having a high thermal conductivity is preferable for a base material of the circuit board 10, and it is preferable to use a resin substrate such as a glass epoxy substrate as the circuit board 10.

As described above, according to the present embodiment, it is possible to perform wire connection between a mount board and an electronic device while preventing damage of electronic components mounted on the mount board.

Second Embodiment

Figure 5:
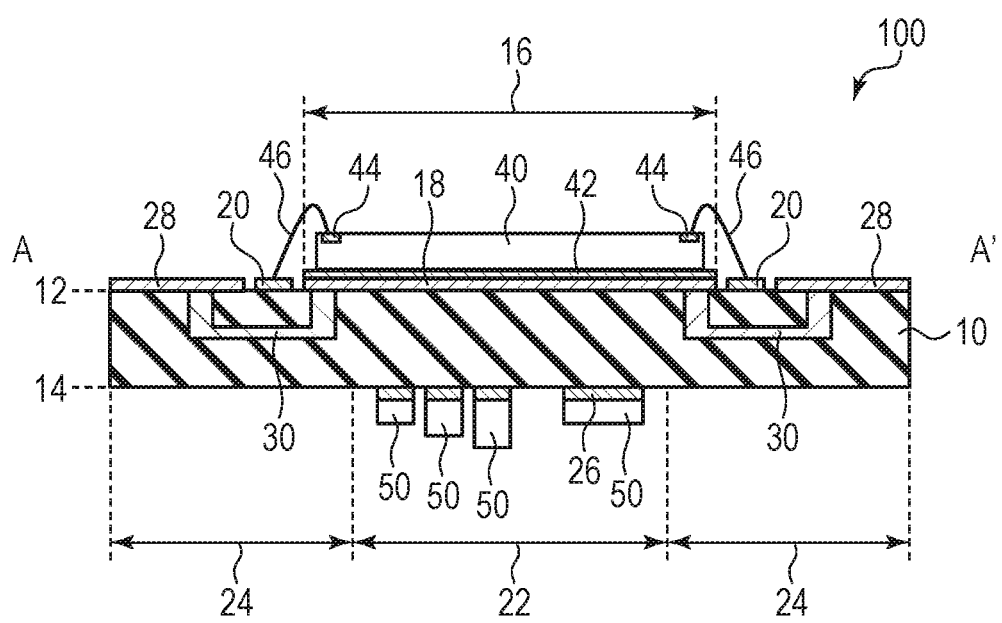
FIG. 5 is a schematic cross-sectional view illustrating the structure of a module according to a second embodiment of the present invention.
Figure 6:
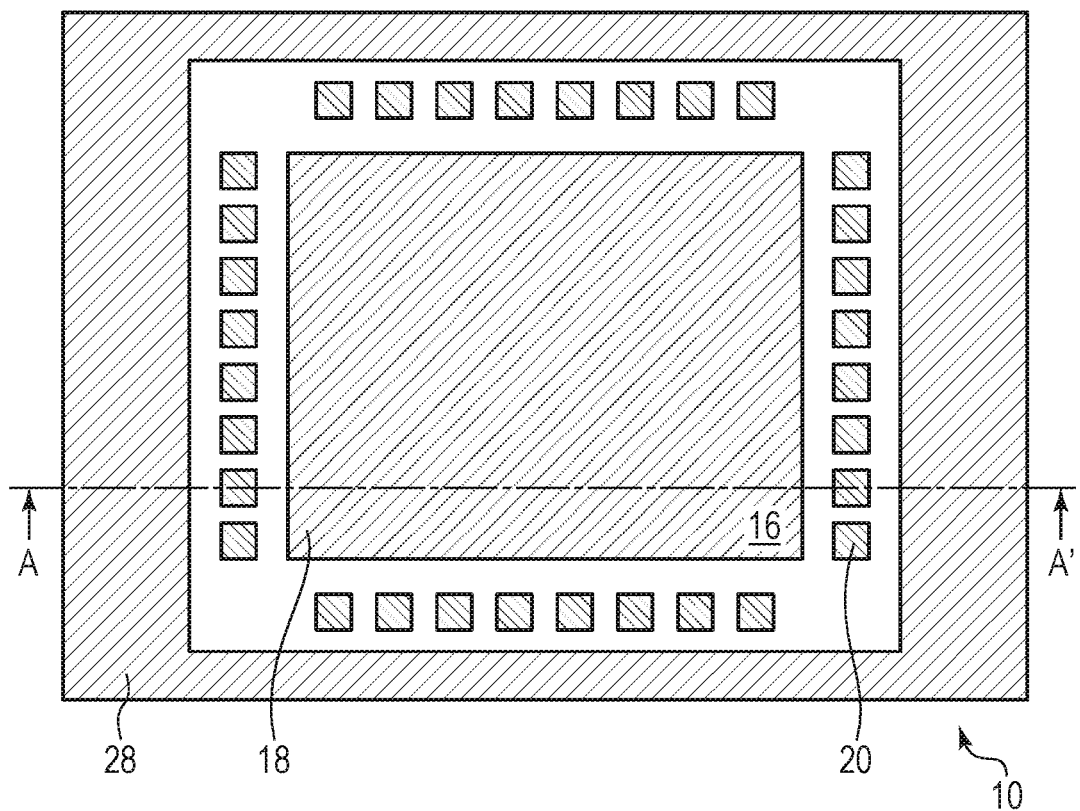
FIG. 6 and FIG. 7 are plan views illustrating the structure of a circuit board of the module according to the second embodiment of the present invention.
Figure 7:
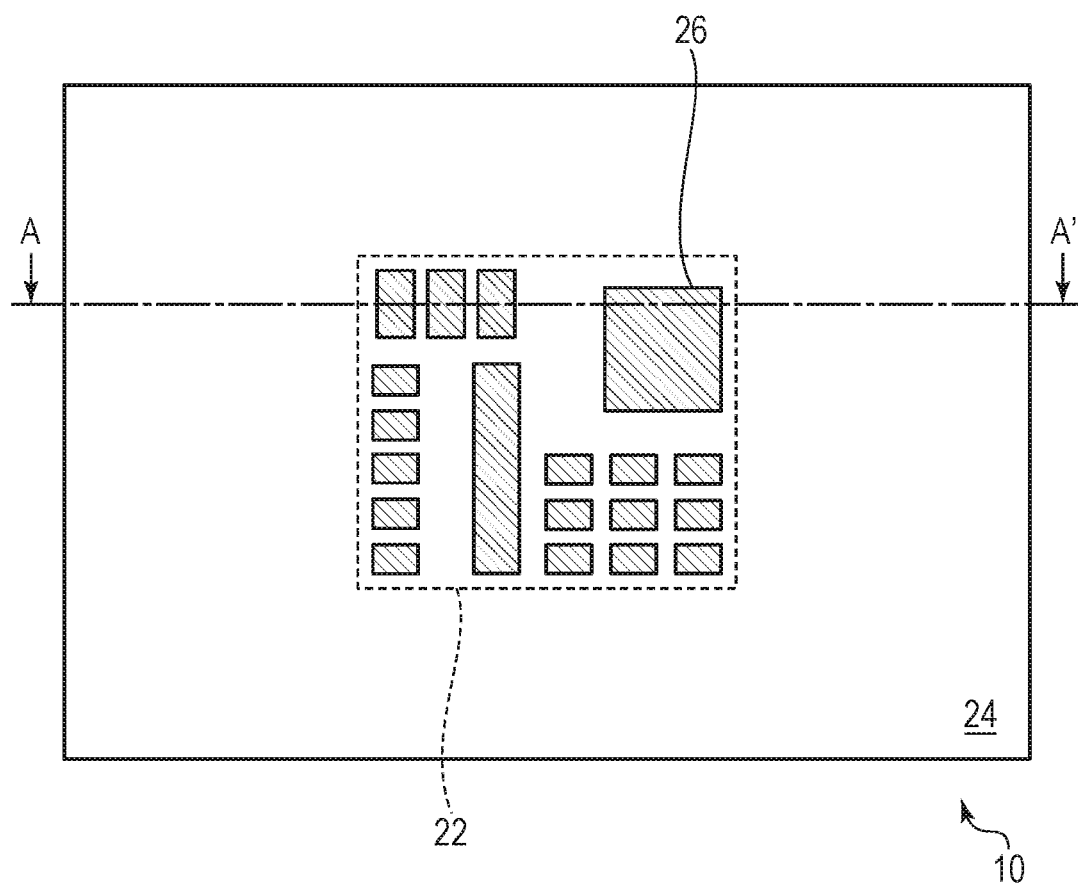
Figure 8A:
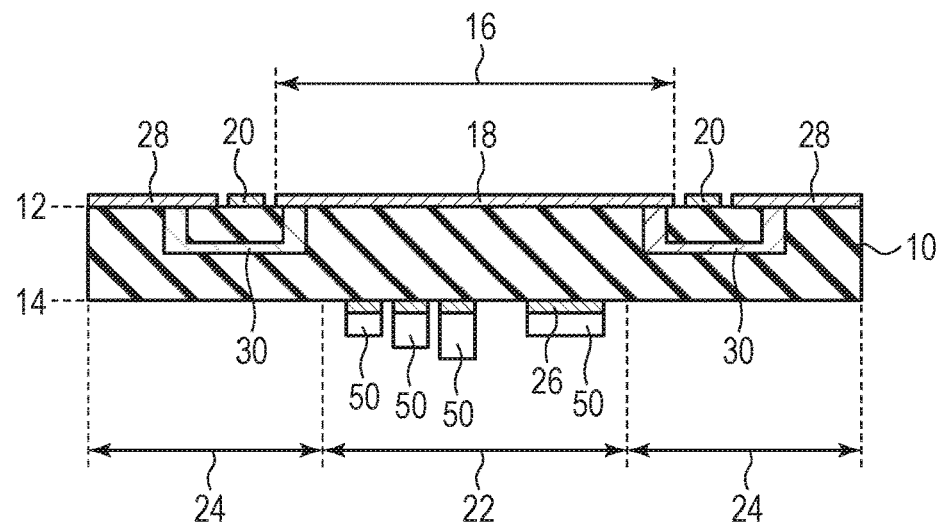
FIG. 8A, FIG. 8B and FIG. 8C are cross-sectional views illustrating a method of manufacturing the module according to the second embodiment of the present invention.
Figure 8B:
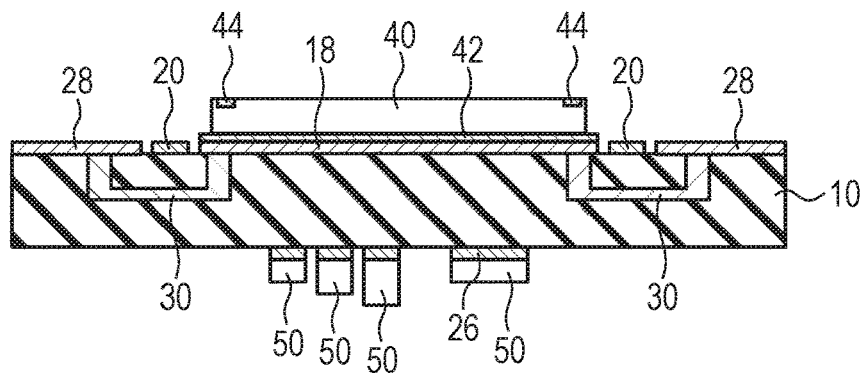
Figure 8C:
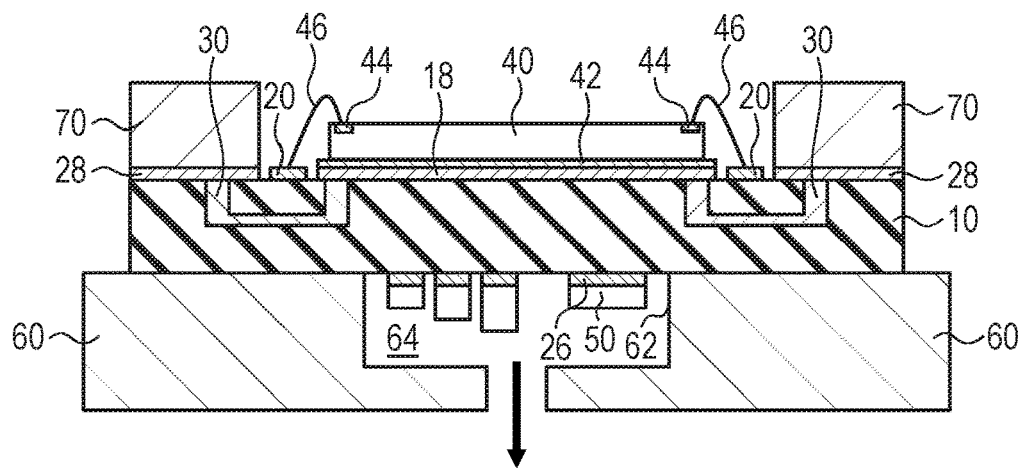

A module and a method of manufacturing the same according to a second embodiment of the present invention will be described with reference to FIG. 5 to FIG. 8C. Components similar to those of the module according to the first embodiment are labeled with the same references, and the description thereof will be omitted or simplified. FIG. 5 is a schematic cross-sectional view illustrating the structure of a module according to the present embodiment. FIG. 6 and FIG. 7 are plan views illustrating the structure of the module according to the present embodiment. FIG. 8A to FIG. 8C are cross-sectional views illustrating a method of manufacturing the module according to the present embodiment.

First, the structure of a module according to the present embodiment will be described by using FIG. 5 to FIG. 7.

As illustrated in FIG. 5, the module 100 according to the present embodiment is the same as the module according to the first embodiment except that the metal pattern 28 is arranged on the first face 12 side of the circuit board 10. That is, the circuit board 10 of the module according to the present embodiment includes the metal pattern 18, the metal pattern 28, and the electrodes 20 provided on the first face 12 side and the electrodes 26 provided on the second face 14 side. Further, the circuit board 10 further includes the members 30 that electrically and thermally connect the metal pattern 18 and the metal pattern 28 to each other.

FIG. 6 is a plan view of the circuit board 10 when viewed from the first face 12 side. The metal pattern 18 is provided in the imaging-device mount region 16 of the first face 12 of the circuit board 10. The electrodes 20 are provided in the periphery of the imaging-device mount region 16 of the first face 12 of the circuit board 10. The metal pattern 28 is provided in the outer circumference part of the first face 12 so as to surround a region in which the metal pattern 18 and the electrodes 20 are provided. The region in which the metal pattern 28 is provided is a region overlapping the non-component mount region 24 in a direction perpendicular to the first face 12. The metal patterns 18 and 28 and the electrodes 20 may be formed of the same metal layer. The same metal layer as used herein means that the metal patterns 18 and 28 and the electrodes 20 have substantially the same distance from the substrate. Having substantially the same distance from the substrate means that the distance difference of both is less than the thickness of the metal patterns 18 and 28.

FIG. 7 is a plan view of the circuit board 10 when viewed from the second face 14 side. The electrodes 26 are provided in the component mount region 22 of the second face 14 of the circuit board 10.

FIG. 5 illustrates an example of forming the metal pattern 28 by using an interconnection layer located in the outermost layer on the first face 12 side. When the circuit board 10 is a multilayer substrate, a buildup substrate, or the like, the metal pattern 28 may be formed by using an interconnection layer located inside the circuit board 10. In such a case, it is preferable that the metal pattern 28 be located on the first face 12 side of a position which divides the thickness of the circuit board 10 into two equal parts. The area of the metal pattern 28 in the planar view is larger than the area of the electrodes 44 of the electronic device 40 or the electrodes 20 in the planar view.

The metal pattern 18 and the metal pattern 28 are connected to each other via the members 30. While FIG. 5 illustrates an example in which the members 30 are each formed of an interconnection layer and a conductive via provided inside the circuit board 10, the member 30 may be formed of an interconnection layer located in the outermost layer on the first face 12 side. The form of connection between the metal pattern 18 and the metal pattern 28 by using the members 30 may be appropriately determined in accordance with the layout or the like of the electrodes 20 or other interconnections.

It is desirable that the metal pattern 28 and the electrodes 26 be formed of separate conductive patterns that are not electrically connected. Thereby, when the electronic device 40 is heated via the metal pattern 28, heat is mostly transferred from the metal pattern 28 to the metal pattern 18, and the metal pattern 18 can be efficiently heated. Further, it is possible to suppress the electronic components 50 from being heated by heat transfer from the metal pattern 28 to the electrodes 26. In particular, in the present embodiment, since the metal pattern 28 is arranged on the first face 12, which is the opposite side of the second face 14 on which the electronic components 50 are mounted, it is possible to suppress a rise in temperature of the electronic components 50 more than the case of the first embodiment. Such a wiring form is more effective when the circuit board 10 is formed of a material having a small thermal conductivity, for example, when the circuit board 10 is a glass epoxy substrate.

Note that, while the metal pattern 28 and the electrodes 26 being not conducted is one preferable form, it is possible to form the metal pattern 28 and the electrodes 26 to be conducted. In such a case, a wiring connected between the metal pattern 28 and the electrodes 26 is made suitable such that the thermal resistance value between the metal pattern 18 and the metal pattern 28 is lower than the thermal resistance value between the metal pattern 28 and the electrodes 26. For example, the thermal resistance value between the metal pattern 28 and the electrodes 26 can be increased by increasing the wiring length or reducing the wiring width between the metal pattern 28 and the electrodes 26. It is desirable that the thermal resistance value between the metal pattern 18 and the metal pattern 28 be less than or equal to one-tenth of the thermal resistance value between the metal pattern 28 and the electrodes 26.

Next, the method of manufacturing the module according to the present embodiment will be described by using FIG. 8A to FIG. 8C. Note that features different from those in the method of manufacturing the module according to the first embodiment will be mainly described here, and the description of the same features as those in the method of manufacturing the module according to the first embodiment will be omitted as appropriate.

First, the circuit board 10 is prepared. The circuit board 10 in the present embodiment includes the metal pattern 18, the metal pattern 28, and the electrodes 20 provided on the first face 12 side and the electrodes 26 provided on the second face 14 side as described previously. In addition, the circuit board 10 further includes the members 30 that electrically and thermally connect the metal pattern 18 and the metal pattern 28 to each other.

Next, in the same manner as the method of manufacturing the module according to the first embodiment, the electronic components 50 are joined on the electrodes 26 provided in the component mount region 22 of the second face 14 of the circuit board 10 by soldering or the like (FIG. 8A). Thereby, the circuit board 10 on which the electronic components 50 are electrically connected to the electrodes 26 is prepared.

Next, in the same manner as the method of manufacturing the module according to the first embodiment, the electronic device 40 is joined on the metal pattern 18 provided in the imaging-device mount region 16 of the first face 12 of the circuit board 10 by using the die bonding paste 42 or the like (FIG. 8B).

Next, in the same manner as the method of manufacturing the module according to the first embodiment, the electrodes 44 of the electronic device 40 and the electrodes 20 of the circuit board 10 are connected to each other by the bonding wires 46 (FIG. 8C).

First, the circuit board 10 on which the electronic device 40 and the electronic components 50 are mounted is placed on the board support stage 60 of a wire bonding apparatus. The circuit board 10 is placed on the board support stage 60 such that the second face 14 side faces the board support stage 60. Thereby, the circuit board 10 is contacted with the board support stage 60 in the non-component mount region 24 of the second face 14. On the other hand, the concave part 62 is provided in a portion corresponding to the component mount region 22 of the board support stage 60, and thereby the electronic components 50 or the electrodes 26 does not contact with the board support stage 60 when the circuit board 10 is placed on the board support stage 60.

An exhausting apparatus (not illustrated) is connected to the space 64 defined by the circuit board 10 and the concave part 62 of the board support stage 60. Thereby, the space 64 can be vacuumed as schematically illustrated by an arrow in FIG. 8C. Thereby, the circuit board 10 is fixed to the board support stage 60, and the circuit board 10 is stuck to the board support stage 60.

Next, the electronic device 40 of the circuit board 10 placed on the board support stage 60 is heated. The wire bonding apparatus includes the heater apparatus 70 such as a heater above the board support stage 60. When the electronic device 40 is heated, the heater apparatus 70 is stuck to the metal pattern 28 from the first face 12 side of the circuit board 10. By increasing the temperature of the heater apparatus 70 in this state, it is possible to heat the metal pattern 28 of the circuit board 10. Further, since the metal pattern 28 is thermally connected to the metal pattern 18 via the members 30, which are thermal conductive members, when the metal pattern 28 is heated, the metal pattern 18 can be heated, and thus the electronic device 40 can be heated. With the metal pattern 28, the members 30, and the metal pattern 18 being formed of a material having a high thermal conductivity, for example, copper, the electronic device 40 can be effectively heated.

At this time, since the electronic components 50 are mounted on the second face 14 side, which is opposite to the first face 12 on which the metal pattern 28 heated by the heater apparatus 70 is provided, and are arranged inside the space 64 in which the pressure is reduced and no air exists, the electronic components 50 are less likely to be affected by heat emitted from the heater apparatus 70. Further, since a part between the electronic components 50 and the metal pattern 28 is not electrically conducted or has a larger thermal resistance than the path between the metal pattern 28 and the metal pattern 18, the heat from the metal pattern 28 is less likely to transfer to the electronic components 50. It is therefore possible to suppress a rise in temperature of the electronic components 50 due to heating of the heater apparatus 70.

As described above, by having a state where the electronic device 40 has been heated at a predetermined temperature, it is possible to connect the electrodes 44 of the electronic device 40 and the electrodes 20 by the bonding wires 46 by using a known wire bonding method. At this time, according to the configuration of the present embodiment, since the rise in temperature of the electronic components 50 can be suppressed, a component whose heat resistant temperature is less than or equal to around 150 degrees Celsius can also be used as the electronic components 50.

As described above, according to the present embodiment, it is possible to perform wire connection between a mount board and an electronic device while preventing damage of electronic components mounted on the mount board.

Third Embodiment

Figure 9:
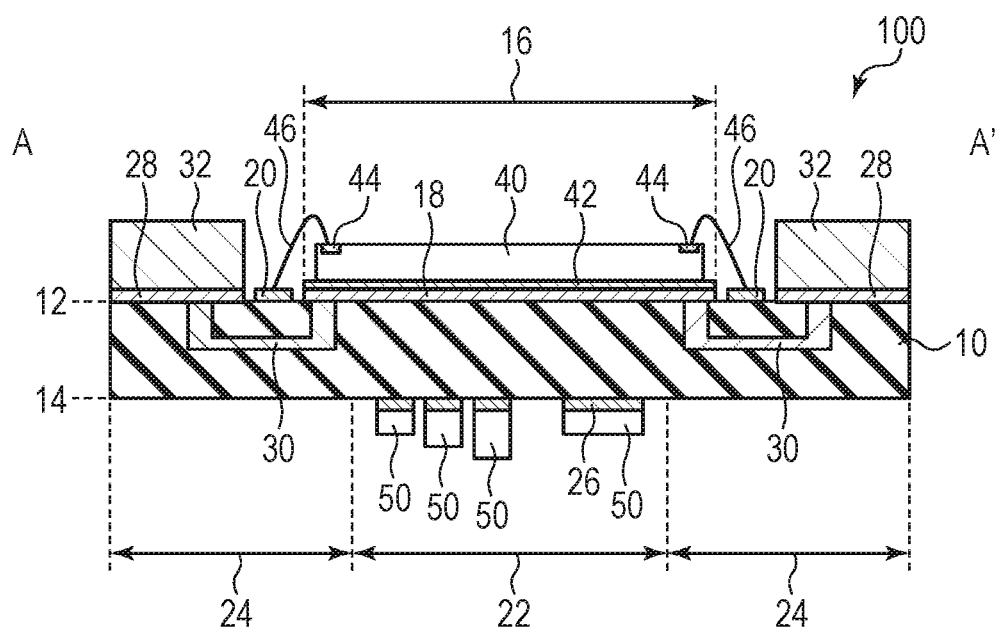
FIG. 9 is a schematic cross-sectional view illustrating the structure of a module according to a third embodiment of the present invention.

A module and a method of manufacturing the same according to a third embodiment of the present invention will be described with reference to FIG. 9 to FIG. 10C. Components similar to those of the module according to the first and second embodiments are labeled with the same references, and the description thereof will be omitted or simplified. FIG. 9 is a schematic cross-sectional view illustrating the structure of a module according to the present embodiment. FIG. 10A to FIG. 10C are cross-sectional views illustrating a method of manufacturing the module according to the present embodiment.

As illustrated in FIG. 9, the module 100 according to the present embodiment is the same as the module according to the second embodiment illustrated in FIG. 5 to FIG. 7 except that a frame member 32 is further provided. The frame member 32 is fixed on the metal pattern 28 along the outer circumference of the first face 12 so as to surround the metal pattern 18 and the electrodes 20. The frame member 32 can be formed of a metal material, a resin material, or the like.

Next, the method of manufacturing the module according to the present embodiment will be described by using FIG. 10A to FIG. 10C. Note that features different from those in the method of manufacturing the module according to the second embodiment will be mainly described here, and the description of the same features as those in the method of manufacturing the module according to the second embodiment will be omitted as appropriate.

First, the circuit board 10 is prepared. The first feature in which the manufacturing method of the present embodiment is different from that of the second embodiment is that the circuit board 10 to which the frame member 32 has been provided in advance is used. That is, as described previously, the circuit board 10 includes the metal pattern 18, the metal pattern 28, the electrodes 20, and the frame member 32 provided on the first face 12 side and the electrodes 26 provided on the second face 14 side. Further, the circuit board 10 further includes the members 30 that electrically and thermally connects the metal pattern 18 and the metal pattern 28 to each other. The frame member 32 is fixed on the metal pattern 28 along the outer circumference of the first face 12 so as to surround a region in which the metal pattern 18 and the electrodes 20 are provided. The frame member 32 can be joined on the circuit board 10 by joining using an adhesive agent, molding, or the like.

Figure 10A:
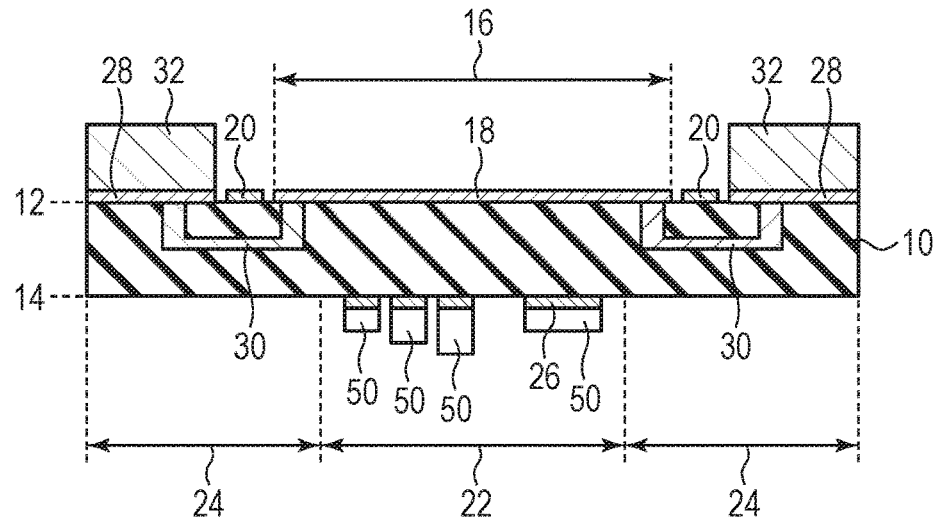
FIG. 10A, FIG. 10B and FIG. 10C are cross-sectional views illustrating a method of manufacturing the module according to the third embodiment of the present invention.

Next, in the same manner as the method of manufacturing the module according to the first embodiment, the electronic components 50 are joined on the electrodes 26 provided in the component mount region 22 of the second face 14 of the circuit board 10 by soldering or the like (FIG. 10A). Thereby, the circuit board 10 on which the electronic components 50 are electrically connected to the electrodes 26 is prepared.

Figure 10B:
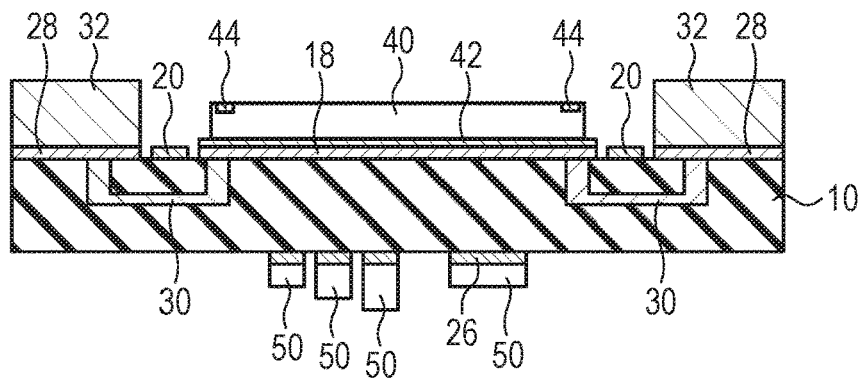

Next, in the same manner as the method of manufacturing the module according to the first embodiment, the electronic device 40 is joined on the metal pattern 18 provided in the imaging-device mount region 16 of the first face 12 of the circuit board 10 by using the die bonding paste 42 or the like (FIG. 10B).

Figure 10C:
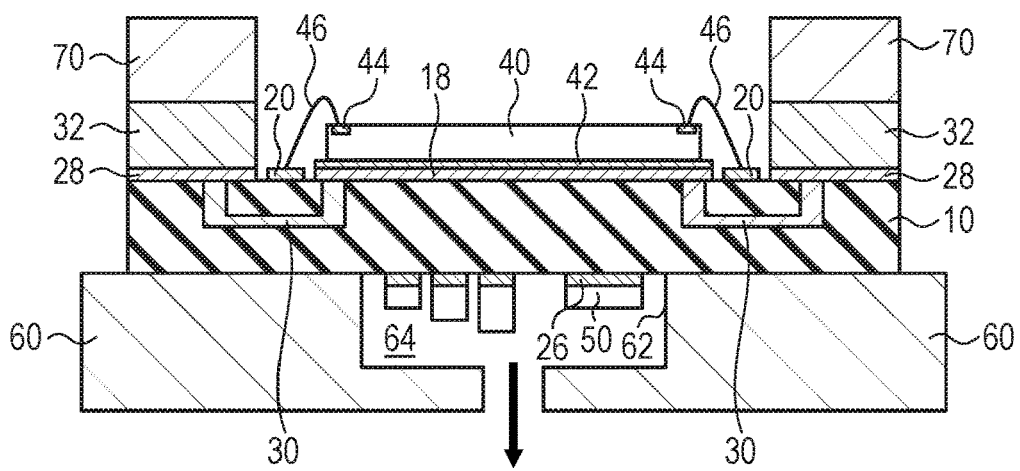

Next, in the same manner as the method of manufacturing the module according to the first embodiment, the electrodes 44 of the electronic device 40 and the electrodes 20 of the circuit board 10 are connected to each other by the bonding wires 46 (FIG. 10C).

First, the circuit board 10 on which the electronic device 40 and the electronic components 50 are mounted is placed on the board support stage 60 of a wire bonding apparatus.

Next, the electronic device 40 of the circuit board 10 placed on the board support stage 60 is heated. The second feature in which the manufacturing method of the present embodiment is different from that of the second embodiment is that the metal pattern 28 is heated via the frame member 32. That is, in the present embodiment, the heater apparatus 70 is stuck to the frame member 32 from the first face 12 side of the circuit board 10. By increasing the temperature of the heater apparatus 70 in this state, it is possible to heat the metal pattern 28 via the frame member 32. Further, since the metal pattern 28 is thermally connected to the metal pattern 18 via the members 30, which are thermal conductive members, when the metal pattern 28 is heated, the metal pattern 18 can be heated, and thus the electronic device 40 can be heated. With the frame member 32, the metal pattern 28, the members 30, and the metal pattern 18 being formed of a material having a high thermal conductivity, for example, copper, the electronic device 40 can be effectively heated.

In terms of effective heating of the electronic device 40, it is desirable that the frame member 32 be formed of a metal material having a good thermal conductivity. While the frame member 32 may be a resin material, in such a case, molding that uses no adhesive agent for connection to the circuit board 10 is preferable.

As described above, according to the present embodiment, it is possible to perform wire connection between a mount board and an electronic device while preventing damage of electronic components mounted on the mount board.

Fourth Embodiment

Figure 11:
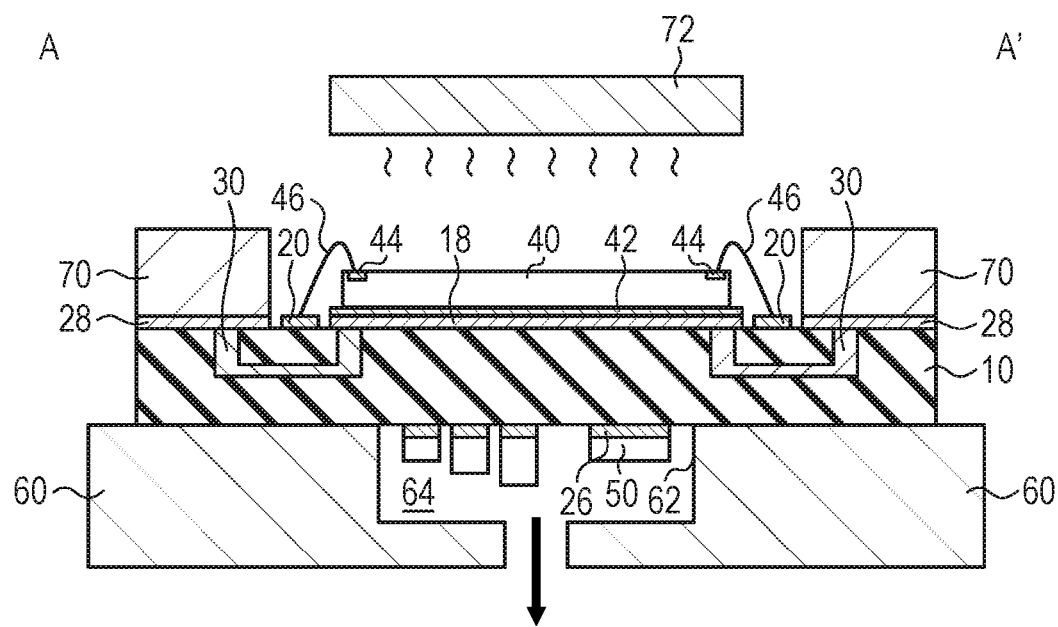
FIG. 11 is a cross-sectional view illustrating a method of manufacturing the module according to a fourth embodiment of the present invention.

A method of manufacturing a module according to a fourth embodiment of the present invention will be described with reference to FIG. 11. Components similar to those of the module according to the first to third embodiments are labeled with the same references, and the description thereof will be omitted or simplified. FIG. 11 is a cross-sectional view illustrating a method of manufacturing the module according to the present embodiment.

The method of manufacturing the module according to the present embodiment is the same as the method of manufacturing the module according to the first to third embodiments except that an infrared source 72 is further used as a unit for heating the electronic device 40. Note that, while described here as a modified example of the method of manufacturing the module according to the second embodiment, the present embodiment can also be applied to the method of manufacturing the modules according to the first embodiment and the third embodiment. Further, features different from those in the method of manufacturing the module according to the second embodiment will be mainly described here, and the description of the same features as those in the method of manufacturing the module according to the second embodiment will be omitted as appropriate.

FIG. 11 is a cross-sectional view in a step corresponding to FIG. 8C of the second embodiment. In the present embodiment, the infrared source 72 installed above the electronic device 40 on the first face 12 side is further used in addition to the heater apparatus 70 as a unit for heating the electronic device 40. The infrared source 72 is an infrared heater or the like and can emit an infrared ray.

Further, in the module according to the present embodiment, a paste containing a material which can absorb infrared rays is used as the die bonding paste 42 used for joining the electronic device 40 to the circuit board 10. Alternatively, an infrared absorption layer (not illustrated) formed of a material that can absorb infrared rays may be provided separately from the die bonding paste 42 between the electronic device 40 and the metal pattern 18. A material that can absorb infrared rays may be, for example, a carbon, a graphite, or the like. When a filler that absorbs infrared rays, such as a carbon, a graphite, or the like, is added to the die bonding paste 42, the adhesive agent, or the like, the resultant can be utilized as an infrared absorption layer.

When the electronic device 40 is made of a silicon-based material, the infrared ray emitted from the infrared source 72 is substantially not absorbed and transmits the electronic device 40 and then is absorbed in the infrared absorption layer (the die bonding paste 42). Since the infrared absorption layer absorbing the infrared ray generates heat, it is possible to heat the electronic device 40. Further, since the infrared absorption layer (the die bonding paste 42) is provided on the first face 12 side of the circuit board 10, the electronic components 50 are substantially not heated, and the electronic device 40 can be effectively heated.

As described above, according to the present embodiment, it is possible to perform wire connection between a mount board and an electronic device while preventing damage of electronic components mounted on the mount board.

Fifth Embodiment

Figure 12:
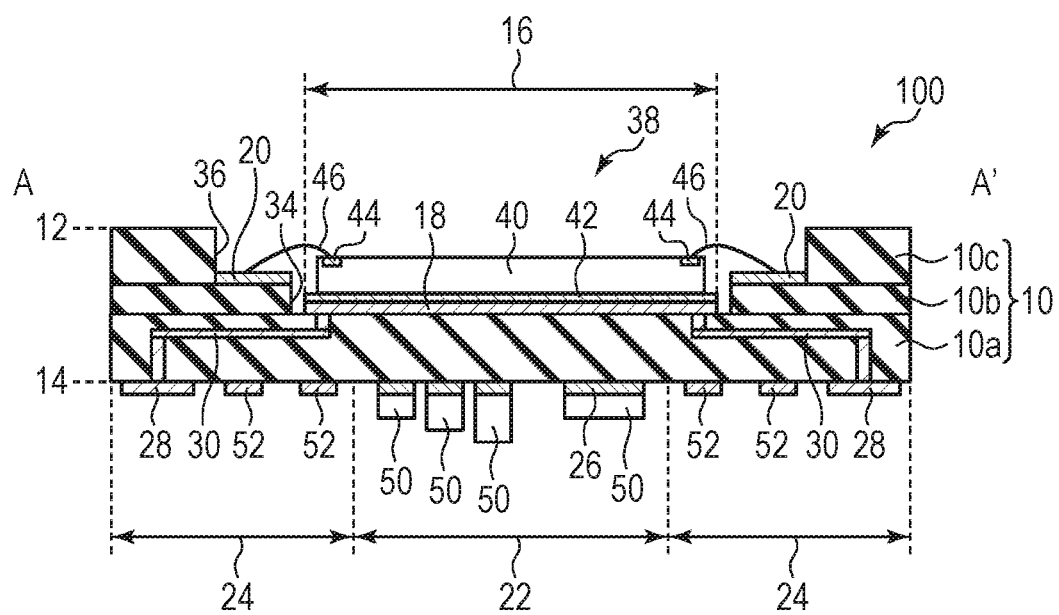
FIG. 12 is a schematic cross-sectional view illustrating the structure of a module according to a fifth embodiment of the present invention.
Figure 13:
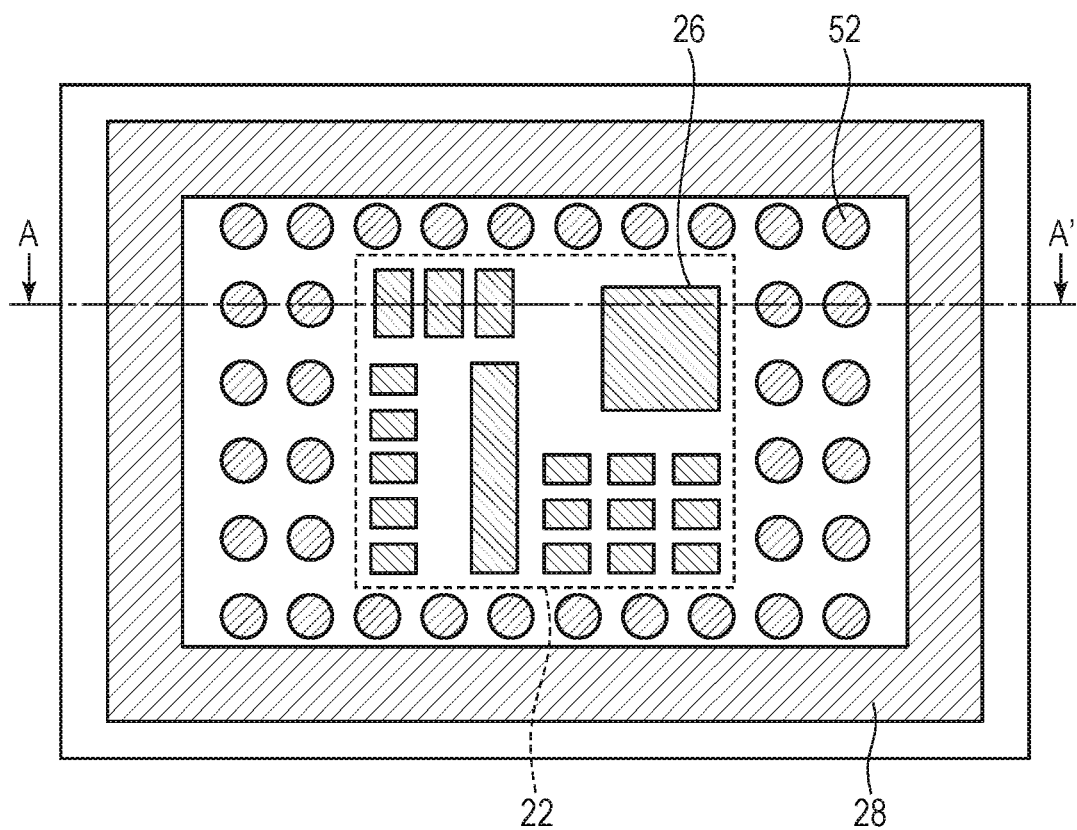
FIG. 13 is a plan view illustrating the structure of a circuit board of the module according to the fifth embodiment of the present invention.
Figure 14A:
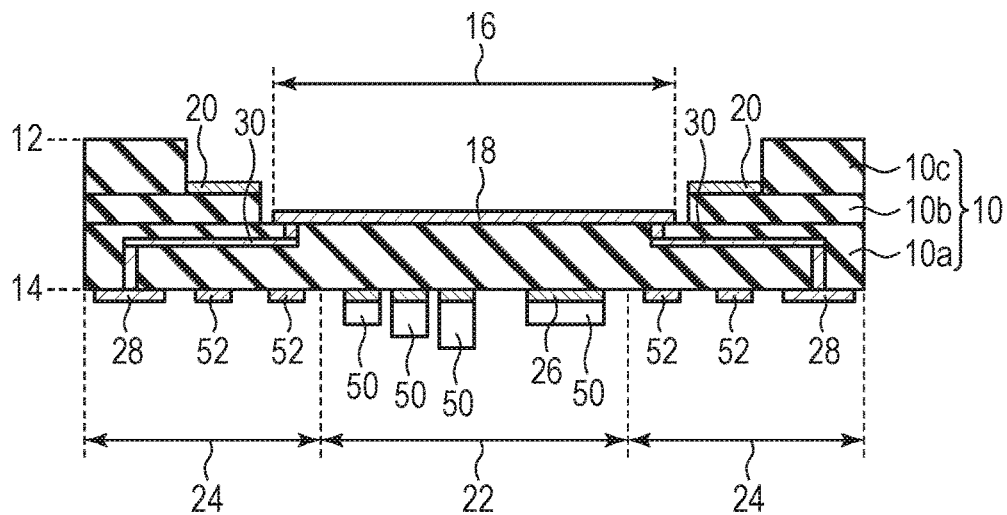
FIG. 14A, FIG. 14B and FIG. 14C are cross-sectional views illustrating a method of manufacturing the module according to the fifth embodiment of the present invention.
Figure 14B:
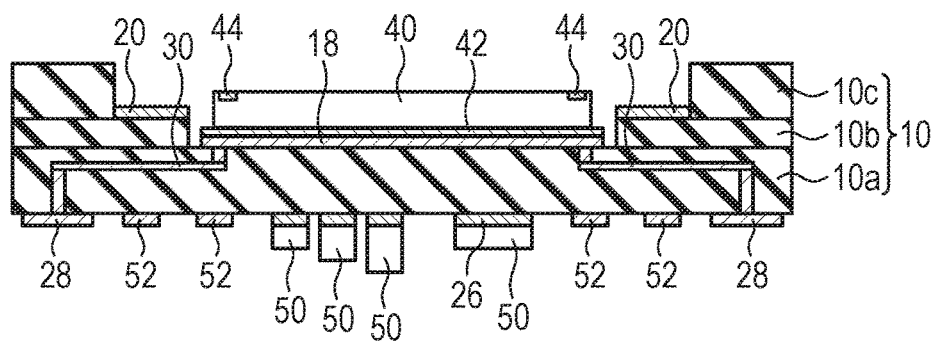
Figure 14C:
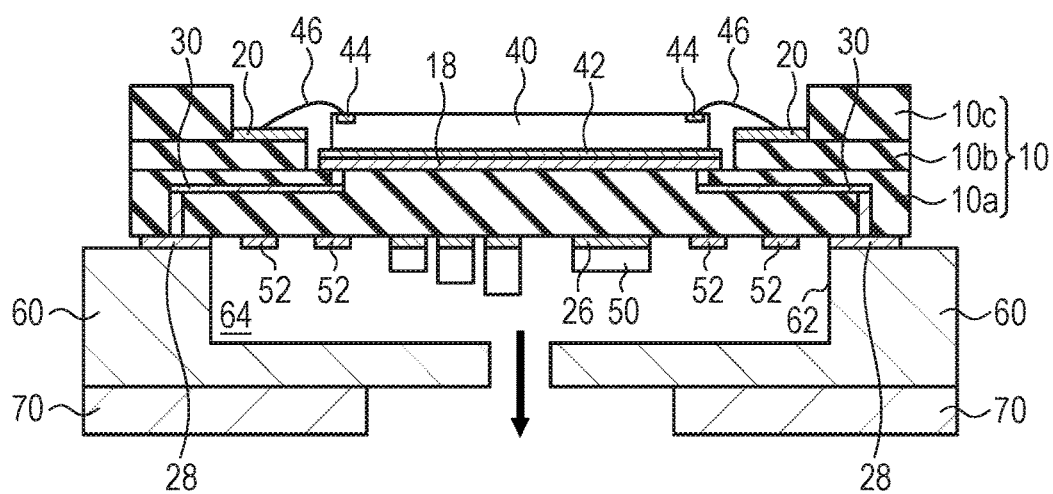

A module and a method of manufacturing the same according to a fifth embodiment of the present invention will be described with reference to FIG. 12 to FIG. 14C. Components similar to those of the module according to the first to fourth embodiments are labeled with the same references, and the description thereof will be omitted or simplified. FIG. 12 is a schematic cross-sectional view illustrating the structure of a module according to the present embodiment. FIG. 13 is a plan view illustrating the structure of the module according to the present embodiment. FIG. 14A to FIG. 14C are cross-sectional views illustrating a method of manufacturing the module according to the present embodiment.

As illustrated in FIG. 12, in the module 100 according to the present embodiment, the circuit board 10 is formed of a stacked ceramic package in which a first layer 10a, a second layer 10b, and a third layer 10c are stacked in this order. The surface of the third layer 10c, which is opposite to the side in contact with the second layer 10b, forms the first face 12 of the circuit board 10, and the surface of the first layer 10a, which is opposite to the side in contact with the second layer 10b, forms the second face 14 of the circuit board 10. The second layer 10b is made of a frame member having an opening 34 in the center part in the planar view. Similarly, the third layer 10c is made of a frame member having an opening 36 in the center part in the planar view. Thereby, a cavity 38 for accommodating the electronic device 40 is formed on the first face 12 side of the circuit board 10. The second layer 10b and the third layer 10c may function as frame members.

The opening 36 provided in the third layer 10c is wider than the opening 34 provided in the second layer 10b, and a part of the surface on the first face 12 side of the second layer 10b is exposed in the cavity 38. The electrodes 20 are provided on this surface of the second layer 10b exposed in the cavity 38. A region of the first layer 10a located inside the opening 34 provided in the second layer 10b corresponds to the imaging-device mount region 16. The metal pattern 18 is provided in the imaging-device mount region 16.

FIG. 13 is a plan view of the circuit board 10 when viewed from the second face 14 side. The electrodes 26 are provided in the component mount region 22 in the center part of the second face 14 of the circuit board 10. External terminals 52 such as an LGA terminal, an LCC terminal, or the like are provided in the non-component mount region 24 surrounding the component mount region 22. Each of the external terminals 52 is a terminal such as an input terminal, an output terminal, a clock input terminal, a ground terminal, a power source terminal or the like and electrically connected to the electronic device 40 via an interconnection layer (not illustrated) inside the circuit board 10, the electrode 20, the bonding wire 46, or the like. A connector is also a type of the external terminal 52. The metal pattern 28 is provided in the outer circumference part of the second face 14 so as to surround a region in which the electrodes 26 and the external terminals 52 are provided. The metal pattern 28 is electrically and thermally connected to the metal pattern 18 via the members 30 provided inside the first layer 10a.

Note that, while an example in which the circuit board 10 is formed of the three-layer structure stack ceramic package is illustrated in FIG. 12, the layer structure forming the circuit board 10 is not particularly limited. Further, the first layer 10a, the second layer 10b, and the third layer 10c are not intended to mean that each layer includes a single interconnection layer, and each layer may include a plurality of interconnection layers.

Next, the method of manufacturing the module according to the present embodiment will be described by using FIG. 14A to FIG. 14C. Note that features different from those in the method of manufacturing the module according to the first to fourth embodiments will be mainly described here, and the description of the same features as those in the method of manufacturing the module according to the first to fourth embodiments will be omitted as appropriate.

First, the circuit board 10 is prepared. As described previously, the circuit board 10 includes the metal pattern 18 and the electrodes 20 provided on the first face 12 side and the electrodes 26, the external terminals 52, and the metal pattern 28, and the member 30 electrically and thermally connecting the metal pattern 18 and the metal pattern 28 to each other provided on the second face 14 side.

Next, in the same manner as the method of manufacturing the module according to the first embodiment, the electronic components 50 are joined on the electrodes 26 provided in the component mount region 22 of the second face 14 of the circuit board 10 by soldering or the like (FIG. 14A). Thereby, the circuit board 10 on which the electronic components 50 are electrically connected to the electrodes 26 is prepared.

Next, in the same manner as the method of manufacturing the module according to the first embodiment, the electronic device 40 is joined on the metal pattern 18 provided in the imaging-device mount region 16 of the first face 12 of the circuit board 10 by using the die bonding paste 42 or the like (FIG. 14B).

Next, in the same manner as the method of manufacturing the module according to the first embodiment, the electrodes 44 of the electronic device 40 and the electrodes 20 of the circuit board 10 are connected to each other by the bonding wires 46 (FIG. 14C).

First, the circuit board 10 on which the electronic device 40 and the electronic components 50 are mounted is placed on the board support stage 60 of a wire bonding apparatus. The circuit board 10 is placed on the board support stage 60 such that the second face 14 side faces the board support stage 60. Thereby, the circuit board 10 comes into contact with the board support stage 60 in a portion of the metal pattern 28 provided on the second face 14. On the other hand, the concave part 62 is provided in a portion corresponding to the component mount region 22 and the external terminals 52 of the board support stage 60, and thereby none of the electronic components 50, the electrodes 26, nor the external terminal 52 contacts with the board support stage 60 when the circuit board 10 is placed on the board support stage 60.

Note that, since the external terminals 52 are terminals connected to the electronic device 40, in terms of effective heat transfer to the electronic device 40, there is no particular problem in the external terminal 52 and the board support stage 60 being in contact with each other. When the external terminal 52 and the board support stage 60 are in contact with each other, however, the external terminal 52 may be damaged. The external terminal 52 and the board support stage 60 not being in contact with each other is a preferable form for preventing damage of the external terminal 52.

An exhausting apparatus (not illustrated) is connected to the space 64 defined by the circuit board 10 and the concave part 62 of the board support stage 60. Thereby, the space 64 can be vacuumed as schematically illustrated by an arrow in FIG. 14C. Thereby, the circuit board 10 is fixed to the board support stage 60, and the circuit board 10 is stuck to the board support stage 60.

Next, the electronic device 40 of the circuit board 10 placed on the board support stage 60 is heated. The wire bonding apparatus includes the heater apparatus 70 such as a heater below the board support stage 60. By increasing the temperature of the heater apparatus 70, it is possible to heat the metal pattern 28 of the circuit board 10 via the board support stage 60. Further, since the metal pattern 28 is thermally connected to the metal pattern 18 via the members 30, which are thermal conductive members, when the metal pattern 28 is heated, the metal pattern 18 can be heated, and thus the electronic device 40 can be heated. With the metal pattern 28, the members 30, and the metal pattern 18 being formed of a material having a high thermal conductivity, for example, copper, the electronic device 40 can be effectively heated.

As described above, according to the present embodiment, it is possible to perform wire connection between a mount board and an electronic device while preventing damage of electronic components mounted on the mount board.

Sixth Embodiment

Figure 15:
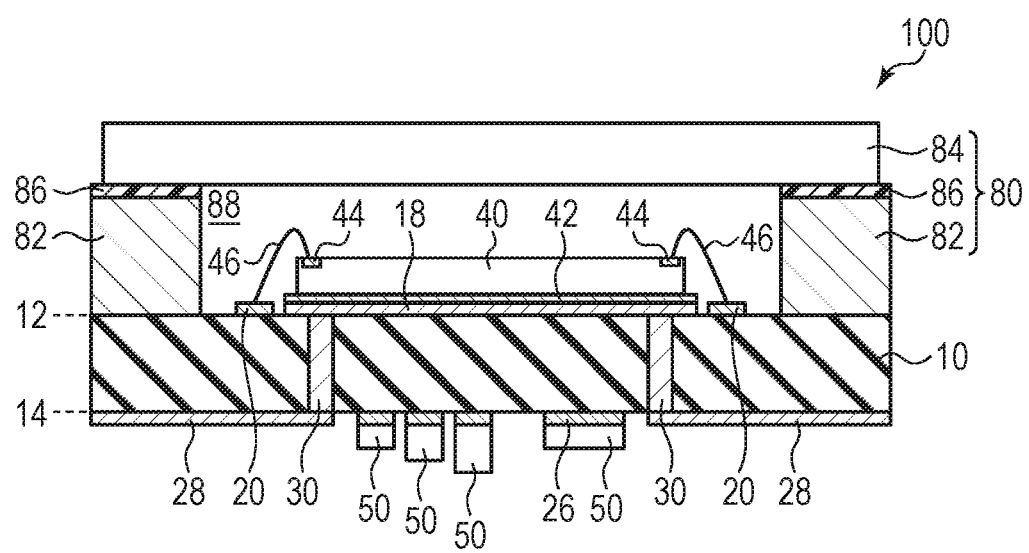
FIG. 15 is a cross-sectional view illustrating a module and a method of manufacturing the same according to a sixth embodiment of the present invention.

A module and a method of manufacturing the same according to a sixth embodiment of the present invention will be described with reference to FIG. 15. Components similar to those of the module according to the first to fifth embodiments are labeled with the same references, and the description thereof will be omitted or simplified. FIG. 15 is a cross-sectional view illustrating a module and a method of manufacturing the same according to the present embodiment.

In the above first to fifth embodiments, as the method of manufacturing the module, the steps up to the wire bonding step to electrically connect the circuit board 10 and the electronic device 40 to each other have been described. After the wire bonding step, a step to form a seal member that protects the electronic device 40 may be further performed.

In the present embodiment, a step to form a seal member that protects the electronic device 40 will be described. The seal member may be, for example, a frame member that partitions the space in which the electronic device 40 is provided and a lid member that covers the space partitioned by the frame member. In the third and fifth embodiments in which the frame member has already been formed before the wire bonding step, the step to form a frame member can be omitted. While the step after the wire bonding step is performed will be described here with an example of the module described in the first embodiment, the same applies to the module described in the second to fifth embodiment.

FIG. 15 is a cross-sectional view illustrating a state where a seal member 80 that covers the electronic device 40 is formed after the step illustrated in FIG. 4C. The seal member 80 includes a frame member 82 and a lid member 84.

The frame member 82 is provided along the outer circumference of the first face 12 on the circuit board 10 so as to surround the region in which the electronic device 40 and the electrodes 20 are provided. The frame 82 is made of a metal material or a resin material. The frame member 82 can be adhered to the circuit board 10 by using an adhesive agent (not illustrated). The frame member 82 may be formed by directly molding a resin material to the circuit board 10.

The lid member 84 is a facing member that faces an electronic device 40 spaced apart from the electronic device 40. The lid member 84 is fixed on the frame member 82 by a fixing member 86 such as an adhesive agent. Thereby, a space 88 accommodating the electronic device 40 is in a sealed state where the electronic device 40 is shielded from the outer air by the seal member 80, and a so-called hollow structure module is formed. The space 88 is filled with air or nitrogen.

The electronic device 40 is not particularly limited but typically is a solid-state imaging device such as a CCD image sensor or a CMOS image sensor. The lid member 84 is formed of a transparent member such as glass or a crystal in terms of introducing an external incident light to the electronic device 40.

As illustrated in FIG. 15, the module 100 according to the present embodiment is formed in a state where the metal pattern 28 is exposed on the second face 14 side of the circuit board 10. As described in the first embodiment, the thermal conductivity is good between the metal pattern 28 and the electronic device 40. Therefore, when the module 100 is driven, by positively utilizing the metal pattern 28, it is also possible to enhance heat dissipation of the electronic device 40. For example, by connecting a heat sink (not illustrated) to the metal pattern 28, it is possible to significantly improve the heat dissipation efficiency of the electronic device 40. Thereby, a module having a high heat dissipation can be provided. The same configuration applies to the case of the stack ceramic package described in the fifth embodiment.

Further, in the module described in the third embodiment, with a heat sink (not illustrated) being connected to the frame member 32 joined on the metal pattern 28, a module having a high heat dissipation can be realized. In particular, such an effect is significant when the frame member 32 is formed of a metal material.

As described above, according to the present embodiment, it is possible to perform wire connection between a mount board and an electronic device while preventing damage of electronic components mounted on the mount board.

Seventh Embodiment

Figure 16:
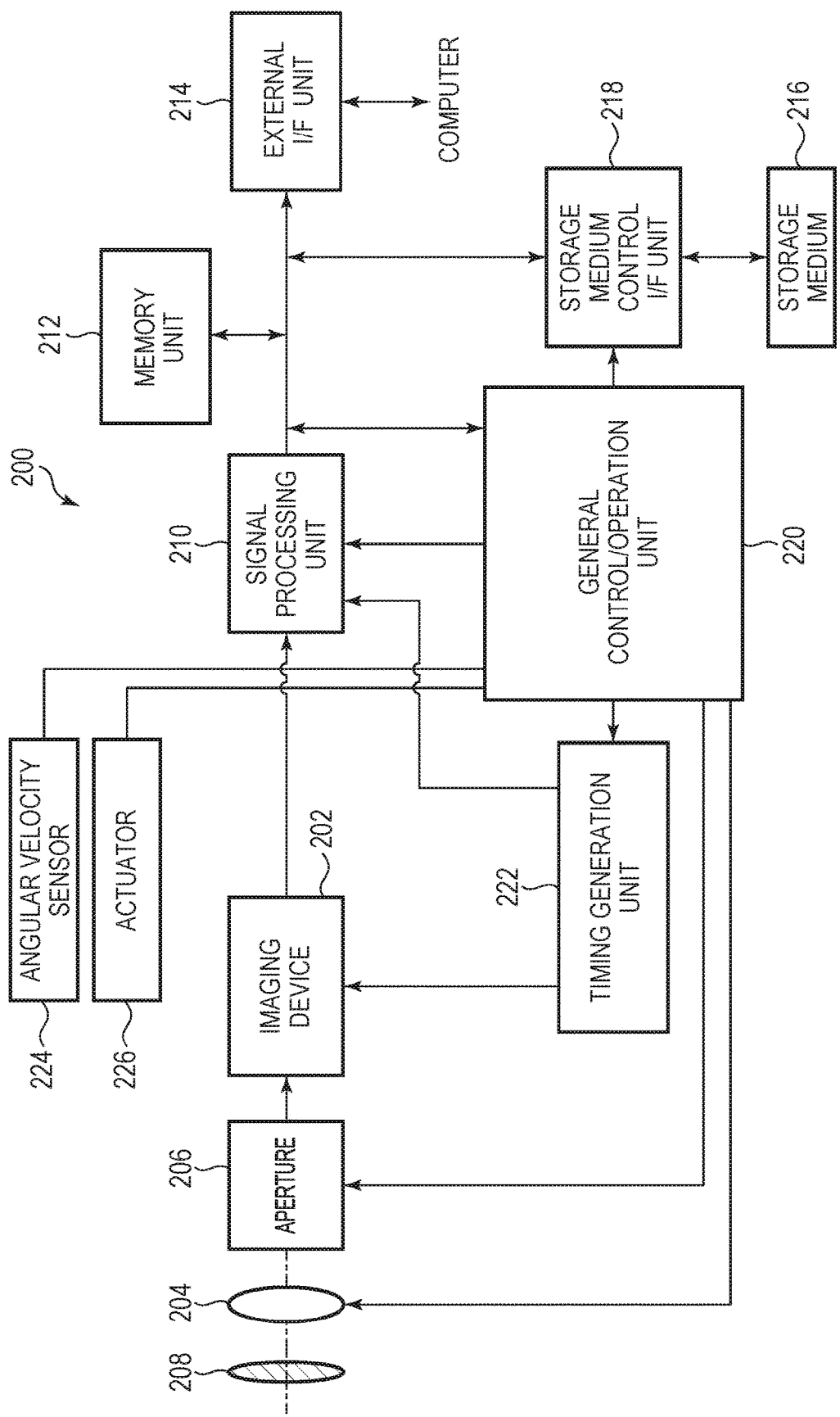
FIG. 16 is a block diagram illustrating a general configuration of an imaging system according to a seventh embodiment of the present invention.
Figure 17A:
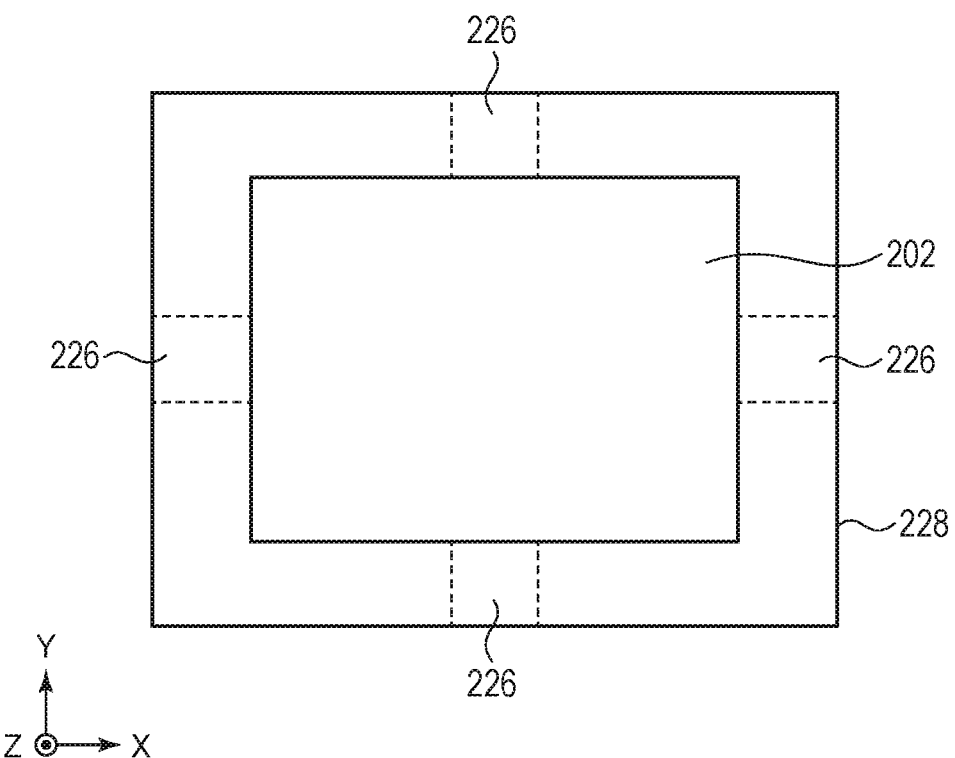
FIG. 17A and FIG. 17B are diagrams illustrating an imaging device in the imaging system according to the seventh embodiment of the present invention.
Figure 17B:
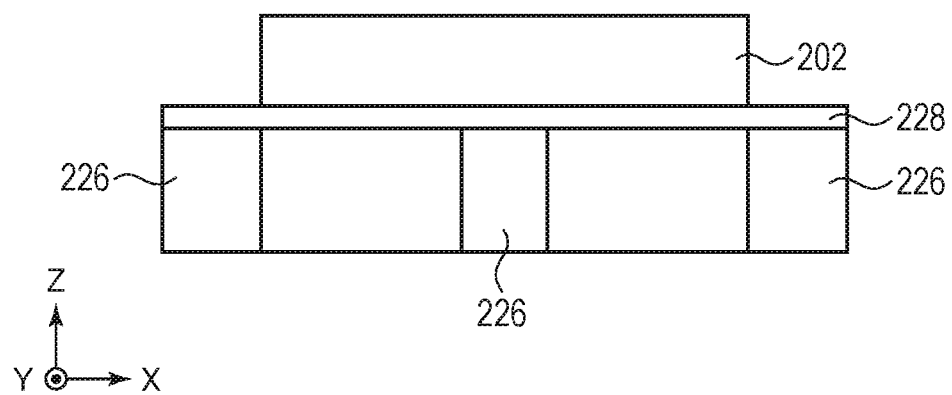

An imaging system according to a seventh embodiment of the present invention will be described with reference to FIG. 16 to FIG. 17B. FIG. 16 is a block diagram illustrating a general configuration of an imaging system according to the present embodiment. FIG. 17A and FIG. 17B are diagrams illustrating an imaging apparatus in the imaging system according to the present embodiment.

The module described in the above first to sixth embodiments is applicable to various imaging systems. Examples of applicable imaging systems may include a digital still camera, a digital camcorder, a surveillance camera, a copying machine, a fax machine, a mobile phone, an on-vehicle camera, an observation satellite, and the like. Further, a camera module including an optical system such as a lens and an imaging apparatus is also included in the imaging system. FIG. 16 illustrates a block diagram of a digital still camera as an example out of these examples.

The imaging system 200 illustrated as an example in FIG. 16 includes an imaging device 202, a lens 204, an aperture 206, a barrier 208, a signal processing device 210, a memory unit 212, an external I/F unit 214, a storage medium 216, a storage medium control I/F unit 218, and a general control/operation unit 220. In addition, the imaging system 200 further includes an angular velocity sensor 224 and an actuator 226.

The barrier 208 protects the lens 204, and the lens 204 captures an optical image of an object on the imaging device 202. The aperture 206 can change the amount of a light that has passed through the lens 204. The imaging device 202 is formed of the module 100 described in any of the first to sixth embodiments and converts an optical image captured by the lens 204 into image data.

The signal processing device 210 performs various correction or data compression on image data output from the imaging device 202. The timing generation unit 222 outputs various timing signals to the imaging device 202 and the signal processing device 210. The general control/operation unit 220 controls the entire digital still camera, and the memory unit 212 temporarily stores image data. The storage medium control OF unit 218 is an interface used for performing storage or readout of image data on the storage medium 216, and the storage medium 216 is a removable storage medium such as a semiconductor memory used for performing storage or readout of imaging data. The external OF unit 214 is an interface used for communicating with an external computer or the like. The timing signal or the like may be externally input to the imaging system 200, and the imaging system 200 may be any imaging system as long as it includes at least the imaging device 202 and the signal processing device 210 that processes an image signal output from the imaging device 202.

The imaging device 202 and an analog-to-digital (AD) converter unit may be provided on the same semiconductor substrate, or the imaging device 202 and the AD converter unit may be formed on separate semiconductor substrates. Further, the imaging device 202 and the signal processing device 210 may be formed on the same semiconductor substrate. Each of the pixels may include a first photoelectric conversion unit and a second photoelectric conversion unit. The signal processing device 210 may be configured to process a pixel signal generated in the first photoelectric conversion unit and a pixel signal generated in the second photoelectric conversion unit to acquire distance information from the imaging device 202 to an object.

The angular velocity sensor 224 is fixed to a casing of the imaging system 200 or the like and detects a camera shake of the imaging system 200. The camera shake is detected as respective amounts of displacement in the X-axis direction and the Y-axis direction on the light receiving surface of the imaging device. The angular velocity sensor 224 is a detection unit that detects motion of the imaging device 202. The actuator 226 is formed of an electromagnetic drive mechanism, a piezo drive mechanism, or the like and displaces the position of the imaging device 202. The actuator 226 is controlled by the general control/operation unit 220 and drives the imaging device 202 in the direction in which the amount of displacement detected by the angular velocity sensor 224 is counteracted.

FIG. 17A and FIG. 17B are diagrams illustrating the imaging device 202 in the present embodiment. FIG. 17A is a plan view of the imaging device 202, and FIG. 17B is a side view of the imaging device 202. The imaging device 202 is attached to the upper face of a substrate 228, and the actuator 226 is provided on the under face of the substrate 228. The actuator 226 can move the imaging device 202 in the X-direction and the Y-direction.

The imaging device 202 in the present embodiment is formed of the module 100 of any of the first to sixth embodiments. In the module 100, the electronic device 40 is directly attached to the circuit board 10 such as a printed board. Thus, the imaging device 202 can be reduced in weight, and a camera shake correction mechanism by using a sensor shift scheme that controls displacement of the imaging device 202 can be employed.

Eighth Embodiment

Figure 18A:
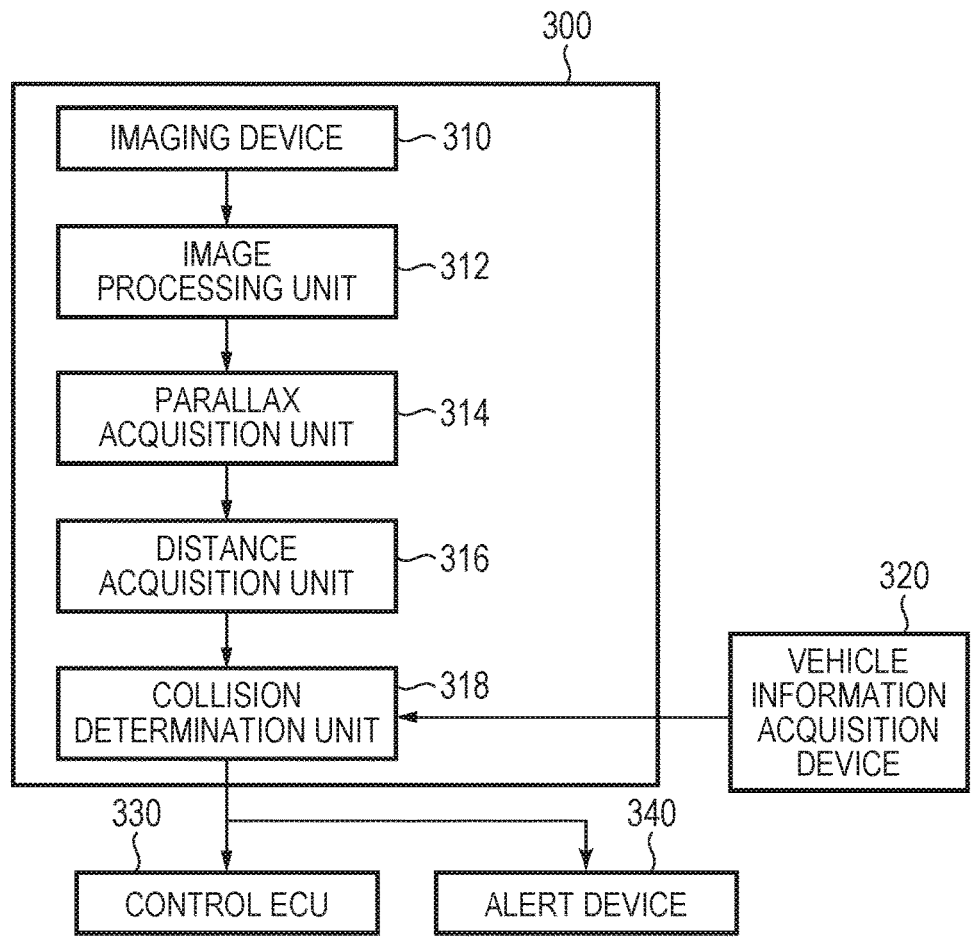
FIG. 18A is a diagram illustrating a configuration example of an imaging system according to an eighth embodiment of the present invention.
Figure 18B:
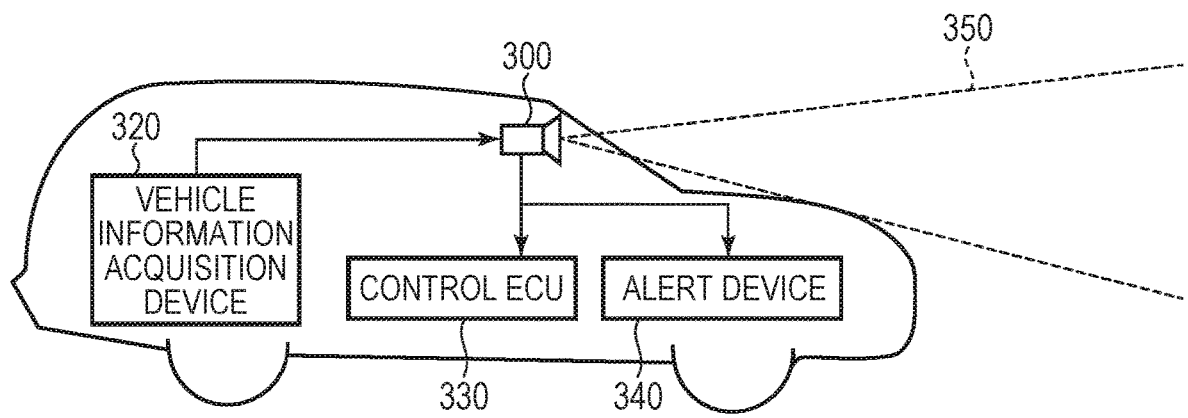
FIG. 18B is a diagram illustrating a configuration example of a movable object according to the eighth embodiment of the present invention.

An imaging system and a movable object according to an eighth embodiment of the present invention will be described with reference to FIG. 18A and FIG. 18B. FIG. 18A is a diagram illustrating a configuration of an imaging system according to the present embodiment. FIG. 18B is a diagram illustrating a configuration of a movable object according to the present embodiment.

FIG. 18A illustrates an example of an imaging system related to an on-vehicle camera. The imaging system 300 includes an imaging device 310. The imaging device 310 is formed of the module 100 described in any of the above first to sixth embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like. The imaging system 300 functions as a control unit that controls the operation of controlling a vehicle as described above.

In the present embodiment, an area around a vehicle, for example, a front area or a rear area is captured by using the imaging system 300. FIG. 18B illustrates the imaging system when a front area of a vehicle (a capturing area 350) is captured. The vehicle information acquisition device 320 as an imaging control unit transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to an apparatus which utilizes object recognition, such as an intelligent transportation system (ITS), without being limited to movable objects. The scope of an equipment as used herein includes an electronic equipment, an imaging equipment, a display equipment, a medical equipment, a transportation equipment (movable object), and the like.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while the electronic device 40 has been illustrated as an example as an electronic device mounted on the circuit board 10 in the above first to sixth embodiments, an electronic device mounted on the circuit board 10 is not limited to the electronic device 40. The present invention can be widely applicable to electronic modules manufactured by using a manufacturing process involving heating, such as a wire bonding step, to mount an electronic device on one side of the faces of a circuit board in which an electronic component is mounted on the other side.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-137580, filed Jul. 23, 2018, which is hereby incorporated by reference herein in its entirety.

What is claimed is:

1. A method of manufacturing a module comprising:
preparing a circuit board that includes a substrate having a first face and a second face, a first metal pattern provided over the first face side, a first electrode provided in a periphery of the first metal pattern over the first face side, a second electrode provided over the second face side, and a second metal pattern thermally connected to the first metal pattern and in which an electronic device is fixed on the first metal pattern and an electronic component is electrically connected to the second electrode; and
connecting the first electrode and a third electrode of the electronic device to each other by a bonding wire with the electronic device being heated,
wherein in the connecting, by using a board support stage, the electronic device is heated by transferring heat supplied to the second metal pattern to the electronic device via the first metal pattern with the circuit board being supported so as to form a space including the electronic component between the second face and the board support stage.

2. The method of manufacturing a module according to claim 1,
wherein the second metal pattern is provided over the second face side, and
wherein in the connecting, heat is supplied from the board support stage to the second metal pattern.

3. The method of manufacturing a module according to claim 1, wherein the third electrode and at least one of the first metal pattern and the second metal pattern are overlapped in a direction perpendicular to the first face.

4. The method of manufacturing a module according to claim 1, wherein a frame member provided so as to surround the electronic device is fixed to the circuit board.

5. The method of manufacturing a module according to claim 1, wherein in the connecting, the space is reduced in pressure.

6. A module comprising:
a circuit board that includes a substrate having a first face and a second face, a first metal pattern provided over the first face side, a first electrode provided in a periphery of the first metal pattern over the first face side, a second metal pattern, and a second electrode provided over the second face side;
an electronic component provided over the second face side and electrically connected to the second electrode;
an electronic device provided over the first face side and joined to the first metal pattern; and
a bonding wire that electrically connects the first electrode and a third electrode of the electronic device to each other,
wherein the second metal pattern is provided on the first face or the second face and connected to the first metal pattern, and
wherein a thermal resistance value between the first metal pattern and the second metal pattern is smaller than a thermal resistance value between the second metal pattern and the second electrode.

7. The module according to claim 6, wherein the second metal pattern is provided so as to surround an orthographic projection region of the electronic component on the second face side.

8. The module according to claim 6, wherein the third electrode and at least one of the first metal pattern and the second metal pattern are overlapped in a direction perpendicular to the first face.

9. The module according to claim 6, wherein the second metal pattern is provided so as to surround an orthographic projection region of the electronic device and the first electrode on the first face side.

10. The module according to claim 9, wherein the electronic device and the first metal pattern are overlapped in a direction perpendicular to the first face.

11. The module according to claim 6, wherein the first metal pattern and the second metal pattern are electrically connected to each other, and the second metal pattern and the second electrode are electrically disconnected from each other.

12. The module according to claim 6, wherein the area of the second metal pattern in a planar view is larger than the area of the electronic device in the planar view.

13. The module according to claim 6, wherein the electronic device is joined to the first metal pattern via an infrared absorption layer.

14. The module according to claim 6 further comprising an external terminal provided on the second face side and electrically connected to the first electrode.

15. The module according to claim 6 further comprising:
a frame member fixed to the circuit board so as to surround the electronic device; and
a facing member provided over the first face side, spaced apart from the electronic device, and facing the electronic device,
wherein the facing member is fixed to the frame member.

16. The module according to claim 6,
wherein the substrate is a glass epoxy substrate, and
the module further comprising a plurality of passive components fixed on the circuit board in an orthographic projection region of the electronic device.

17. The module according to claim 6, wherein a connector of a flexible cable is fixed to the circuit board.

18. The module according to claim 6, wherein the electronic device is an imaging device.

19. The module according to claim 6; and
a signal processing device that processes a signal output from the electronic device.

20. An equipment comprising:
the module according to claim 6;
a detection unit that detects motion of the module; and
an actuator that displaces the module based on a signal from the detection unit.

* * * * *